United States Patent
Romero

(10) Patent No.: US 12,181,538 B2
(45) Date of Patent: Dec. 31, 2024

(54) MAGNETORESISTANCE BRIDGE CIRCUITS WITH STRAY FIELD IMMUNITY

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 112 days.

(21) Appl. No.: 18/070,918

(22) Filed: Nov. 29, 2022

(65) Prior Publication Data

US 2024/0175947 A1 May 30, 2024

(51) Int. Cl.
*G01R 33/09* (2006.01)

(52) U.S. Cl.
CPC ......... *G01R 33/091* (2013.01); *G01R 33/098* (2013.01)

(58) Field of Classification Search
CPC .......... G01R 33/00; G01R 33/0035; G01R 33/0023; G01R 33/0017; G01R 31/3191; G01R 33/091; G01R 33/098; G01B 7/004; G01C 17/38; G06F 3/017; G06F 3/0346; G06F 3/012
See application file for complete search history.

(56) References Cited

U.S. PATENT DOCUMENTS

| | | |
|---|---|---|
| 5,216,560 A | 6/1993 | Brug et al. |
| 5,561,368 A | 10/1996 | Dovek et al. |
| 6,166,539 A | 12/2000 | Dahlberg et al. |
| 6,501,678 B1 | 12/2002 | Lenssen et al. |
| 6,781,359 B2 | 8/2004 | Stauth et al. |
| 7,064,937 B2 | 6/2006 | Wan et al. |
| 7,259,545 B2 | 8/2007 | Stauth et al. |

(Continued)

FOREIGN PATENT DOCUMENTS

| | | |
|---|---|---|
| EP | 2589975 A2 | 5/2013 |
| EP | 2752676 A1 | 7/2014 |

(Continued)

OTHER PUBLICATIONS

Final Office Action dated May 10, 2023 for U.S. Appl. No. 17/660,254; 20 pages.

(Continued)

*Primary Examiner* — Jermele M Hollington
*Assistant Examiner* — Taqi R Nasir
(74) *Attorney, Agent, or Firm* — Daly, Crowley, Mofford & Durkee, LLP

(57) ABSTRACT

Magnetic field sensors having at least two bridges including MR elements are described. MR elements of each bridge have different magnetic reference directions. A first bridge is positioned to sense a first uniform magnetic field of a first polarity and a second bridge is positioned to sense a second uniform magnetic field of a second polarity opposite to the first polarity. The first and second uniform magnetic fields make up a differential field of interest. The described magnetic field sensors sense the field of interest in a manner that is immune to stray fields. Dual signal path embodiments are described in which outputs of the two bridges are independently processed and single signal path embodiments include a single signal path for processing the output of a combined (e.g., parallel) bridge arrangement.

21 Claims, 12 Drawing Sheets

(56) References Cited

U.S. PATENT DOCUMENTS

| | | | |
|---|---|---|---|
| 7,265,531 | B2 | 9/2007 | Stauth et al. |
| 7,838,133 | B2 | 11/2010 | Zhang et al. |
| 8,269,491 | B2 | 9/2012 | Cummings et al. |
| 9,046,562 | B2 | 6/2015 | Cummings et al. |
| 9,465,056 | B2 | 10/2016 | Han et al. |
| 10,060,880 | B2 | 8/2018 | Chen et al. |
| 10,481,181 | B2 | 11/2019 | Bussing et al. |
| 10,509,058 | B2 | 12/2019 | Cadugan et al. |
| 10,578,684 | B2 | 3/2020 | Cadugan et al. |
| 10,670,669 | B2 | 6/2020 | Lassalle-Balier et al. |
| 10,746,820 | B2 | 8/2020 | Lassalle-Balier et al. |
| 10,809,094 | B2 | 10/2020 | Foletto et al. |
| 10,859,643 | B2 | 12/2020 | Lassalle-Balier |
| 10,884,031 | B2 | 1/2021 | Vuillermet et al. |
| 11,127,518 | B2 | 9/2021 | Campiglio et al. |
| 11,175,359 | B2 | 11/2021 | Lassalle-Balier et al. |
| 11,226,382 | B2 | 1/2022 | Augendre et al. |
| 11,346,894 | B2 | 5/2022 | Belin |
| 11,525,875 | B2 | 12/2022 | Lassalle-Balier et al. |
| 11,561,112 | B2 | 1/2023 | Briano et al. |
| 11,719,527 | B2 | 8/2023 | Lassalle-Balier |
| 2007/0096716 | A1 | 5/2007 | Shoji |
| 2007/0132464 | A1 | 6/2007 | Desplats et al. |
| 2008/0012558 | A1* | 1/2008 | Rossler .............. B82Y 25/00 324/252 |
| 2008/0258721 | A1 | 10/2008 | Guo et al. |
| 2008/0272771 | A1 | 11/2008 | Guo et al. |
| 2009/0237075 | A1 | 9/2009 | Koss |
| 2010/0007344 | A1 | 1/2010 | Guo et al. |
| 2010/0277971 | A1 | 11/2010 | Slaughter et al. |
| 2012/0119729 | A1 | 5/2012 | Komasaki et al. |
| 2012/0161756 | A1 | 6/2012 | Paci et al. |
| 2013/0008022 | A1 | 1/2013 | Yao et al. |
| 2013/0265040 | A1 | 10/2013 | Ide et al. |
| 2014/0009145 | A1 | 1/2014 | Suto |
| 2014/0021943 | A1 | 1/2014 | Watanabe et al. |
| 2014/0253106 | A1 | 9/2014 | Granig et al. |
| 2015/0022196 | A1 | 1/2015 | Hebiguchi et al. |
| 2015/0054498 | A1 | 2/2015 | Wada et al. |
| 2015/0177286 | A1 | 6/2015 | Fuji et al. |
| 2015/0198679 | A1 | 7/2015 | Ausserlechner |
| 2015/0333254 | A1 | 11/2015 | Liu et al. |
| 2016/0209479 | A1 | 7/2016 | Hegedus |
| 2016/0359103 | A1 | 12/2016 | Fermon et al. |
| 2017/0045380 | A1* | 2/2017 | Ueda .............. G01D 5/2451 |
| 2017/0314969 | A1 | 11/2017 | Ausserlechner et al. |
| 2017/0322052 | A1 | 11/2017 | Paul et al. |
| 2018/0087889 | A1 | 3/2018 | Ausserlechner et al. |
| 2018/0164387 | A1 | 6/2018 | Raberg |
| 2018/0372810 | A1 | 12/2018 | Jiang et al. |
| 2019/0235032 | A1 | 8/2019 | Lassalle-Balier |
| 2020/0116800 | A1 | 4/2020 | Lassalle-Balier et al. |
| 2020/0309867 | A1* | 10/2020 | Belin .............. G01R 19/32 |
| 2020/0333407 | A1 | 10/2020 | Reimann et al. |
| 2021/0011096 | A1* | 1/2021 | Lassalle-Balier .......... G01R 33/0005 |
| 2021/0285794 | A1 | 9/2021 | Briano et al. |
| 2021/0325486 | A1* | 10/2021 | Cai .............. G01R 33/091 |
| 2022/0278660 | A1 | 9/2022 | Uekura |
| 2023/0332878 | A1 | 10/2023 | Lassalle-Balier et al. |
| 2023/0400537 | A1 | 12/2023 | Lassalle-Balier et al. |

FOREIGN PATENT DOCUMENTS

| | | |
|---|---|---|
| JP | 2015-219058 A | 12/2015 |
| WO | WO 2023/239976 | 12/2023 |

OTHER PUBLICATIONS

U.S. Appl. No. 17/660,254, filed Apr. 22, 2022, Belin.
Office Action dated Aug. 19, 2020 for U.S. Appl. No. 16/364,951; 21 pages.
Response to Office Action dated Aug. 19, 2020 filed on Nov. 13, 2020 for U.S. Appl. No. 16/364,951; 16 pages.
Final Office Action dated Jan. 6, 2021 for U.S. Appl. No. 16/364,951; 32 pages.
Response to Final Office Action dated Jan. 6, 2021 filed on Apr. 5, 2021 for U.S. Appl. No. 16/364,951; 19 pages.
Office Action dated May 11, 2021 for U.S. Appl. No. 16/364,951; 22 pages.
Response to Office Action dated May 11, 2021 filed on Aug. 11, 2021 for U.S. Appl. No. 16/364,951; 12 pages.
Final Office Action dated Sep. 29, 2021 for U.S. Appl. No. 16/364,951; 19 pages.
Response to Final Office Action dated Sep. 29, 2021 filed on Dec. 21, 2021 for U.S. Appl. No. 16/364,951; 10 pages.
Notice of Allowance Dated Feb. 7, 2022 for U.S. Appl. No. 16/364,951; 9 pages.
Office Action dated Nov. 10, 2022 for U.S. Appl. No. 17/660,254; 15 pages.
Response to Office Action dated Nov. 10, 2022 filed on Feb. 7, 2023 for U.S. Appl. No. 17/660,254; 14 pages.
Response to Office Action dated Aug. 17, 2023 for U.S. Appl. No. 17/660,254, filed Nov. 14, 2023; 13 Pages.
Search Report and Written Opinion of the ISA dated Nov. 23, 2023 for International Application No. PCT/US2023/071167; 14 Pages.
Response to Final Office Action dated May 10, 2023 filed on Jul. 31, 2023 for U.S. Appl. No. 17/660,254; 13 pages.
Office Action dated Aug. 17, 2023 for U.S. Appl. No. 17/660,254; 23 pages.
Notice of Allowance dated Mar. 13, 2024 for U.S. Appl. No. 17/660,254, 11 pages.
U.S. Appl. No. 18/333,680, filed Jun. 13, 2023, Jaiswal.
U.S. Appl. No. 18/511,743, filed Nov. 16, 2023, Campiglio et al.
U.S. Appl. No. 18/893,088, filed Sep. 23, 2024, Lassalle-Balier, et al.
Allegro MicroSystems, LLC, "High Sensitivity, 1 MHZ, GMR-Based Current Sensor IC in Space-Saving Low Resistance QFN Package;" ACS 70331 Datasheet dated Nov. 3, 2017; 22 Pages.
Mathon, "Theory of Tunneling Magnetoresistance;" Journal Article from Phase Transitions, vol. 76, Nos. 4-5; Jan. 2003; pp. 491-500; 11 Pages.
Pigeau, "Magnetic Vortex Dynamics Nanostructures;" HAL Open Science, Université Paris Sud; Submitted on Jan. 22, 2013; 85 Pages (Part 1 of 2).
Pigeau, "Magnetic Vortex Dynamics Nanostructures;" HAL Open Science, Université Paris Sud; Submitted on Jan. 22, 2013; 84 Pages (Part 2 of 2).
U.S. Notice of Allowance dated Aug. 22, 2019 for U.S. Appl. No. 15/869,620; 11 Pages.
U.S. 1$^{st}$ Notice of Allowance dated Aug. 8, 2019 for U.S. Appl. No. 15/895,418; 10 Pages.
Amendment and Request for Continued Examination (RCE) dated Sep. 30, 2019 for U.S. Appl. No. 15/895,418; 27 Pages.
U.S. 2$^{nd}$ Notice of Allowance dated Dec. 23, 2019 for U.S. Appl. No. 15/895,418; 13 pages.
U.S. Preliminary Amendment filed on Nov. 1, 2018 for U.S. Appl. No. 16/157,317; 34 Pages.
U.S. Non-Final Office Action dated Feb. 3, 2020 for U.S. Appl. No. 16/157,317; 11 Pages.
Response to U.S. Non-Final Office Action dated Feb. 3, 2020 for U.S. Appl. No. 16/157,317; Response filed Apr. 16, 2020; 17 Pages.
U.S. Notice of Allowance dated Jun. 23, 2020 for U.S. Appl. No. 16/157,317; 7 Pages.
Extended European Search Report dated Mar. 3, 2020 for European Application No. 19202154.1; 7 Pages.
Response to Extended European Search Report dated Mar. 3, 2020 for European Application No. 19202154.1; Response filed Oct. 15, 2020; 114 Pages.
European Examination Report dated Mar. 23, 2022 for European Application No. 19 202 154.1; 5 pages.
Response to Examination Report dated Mar. 23, 2022, filed on Jul. 26, 2022 for European Application No. 19 202 154.1; 38 pages.
Intention to Grant dated Mar. 14, 2024, for European Application No. 19202154.1, 7 pages.
U.S. Notice of Allowance dated Mar. 12, 2020 for U.S. Appl. No. 16/157,313; 14 Pages.

(56) References Cited

OTHER PUBLICATIONS

Restriction Requirement dated Mar. 15, 2024 for U.S. Appl. No. 17/806,336; 6 pages.
Response to Restriction Requirement dated Mar. 15, 2024 for U.S. Appl. No. 17/806,336; Response filed on Mar. 25, 2024; 1 page.
Office Action dated Apr. 17, 2024 for U.S. Appl. No. 17/806,336; 14 pages.
Response to Office Action dated Apr. 17, 2024 for U.S. Appl. No. 17/806,336; Response filed on May 10, 2024; 15 pages.
Final Office Action dated May 29, 2024 for U.S. Appl. No. 17/806,336; 15 pages.
Response to Final Office Action dated May 29, 2024 for U.S. Appl. No. 17/806,336; Response filed on Jun. 27, 2024; 9 pages.
Notice of Allowance dated Jul. 22, 2024 for U.S. Appl. No. 17/806,336; 8 pages.
PCT Invitation to Pay Additional Fee's and Partial International Search Report dated Jun. 15, 2023 for International Application No. PCT/US2023/064522; 14 Pages.
Search Report and Written Opinion dated Aug. 21, 2023 for PCT Application No. PCT/US2023/064522; 22 pages.

\* cited by examiner

MAGNETORESISTANCE BRIDGE CIRCUITS WITH STRAY FIELD IMMUNITY

FIELD

The present disclosure relates generally to magnetic field sensors and more particularly to magnetic field sensors including magnetoresistance bridge circuits with stray field immunity.

BACKGROUND

Magnetic field sensors employ a variety of types of magnetic field sensing elements, for example, Hall effect elements and magnetoresistance elements, often coupled to electronics, often on a common substrate. Some magnetic field sensors include magnetoresistance (MR) elements, such as giant magnetoresistance (GMR) elements and tunneling magnetoresistance (TMR) elements. Generally, GMR and TMR elements have a relatively high sensitivity compared, for example, to Hall effect elements.

Magnetic field sensors are used in a variety of applications, including, but not limited to an angle sensor that senses an angle of a direction of a magnetic field, a current sensor that senses a magnetic field generated by a current flow through a conductor, a magnetic switch that senses the proximity of a ferromagnetic object, a motion detector that senses rotation and/or linear motion, for example motion of passing ferromagnetic articles in the form of magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a change in magnetic field, and linearity, which is the degree to which the output signal of a magnetic field sensing element varies linearly (i.e., in direct proportion) to the magnetic field.

The accuracy with which magnetic field sensors detect an intended magnetic field of interest can be adversely affected by the presence of stray magnetic fields (i.e., fields other than those intended to be detected).

SUMMARY

The present disclosure provides a magnetic field sensor having two or more bridge arrangements of MR elements. MR elements of first and second bridges have different magnetic reference directions. A first bridge is positioned to sense a first uniform magnetic field of a first polarity and a second bridge is positioned to sense a second uniform magnetic field of a second polarity opposite to the first polarity. The first and second uniform magnetic fields make up a differential field of interest. The described magnetic field sensor is configured to sense the field of interest in a manner that is immune to stray fields. Dual signal path embodiments are described in which outputs of the two bridges are independently processed and single signal path embodiments are described in which the single output of a combined (e.g., parallel) bridge arrangement is processed.

According to the disclosure, a magnetic field sensor includes a first bridge and a second bridge. The first bridge includes a first MR element, a second MR element, a third MR element, and a fourth MR element, wherein the first MR element is coupled between a power source and a first output node, the second MR element is coupled between the power source and a second output node, the third MR element is coupled between the second output node and ground, and the fourth MR element is coupled between the first output node and ground. The second bridge includes a fifth MR element, a sixth MR element, a seventh MR element, and an eighth MR element, wherein the fifth MR element is coupled between the power source and a third output node, the sixth MR element is coupled between the power source and a fourth output node, the seventh MR element is coupled between the fourth output node and ground, and the eighth MR element is coupled between the third output node and ground. Each of the first MR element, the third MR element, the fifth MR element, and the seventh MR element has a first magnetic reference direction and each of the second MR element, fourth MR element, sixth MR element, and eighth MR element has a second magnetic reference direction opposite to the first magnetic reference direction.

Features may include one or more of the following individually or in combination with other features. The first bridge can be positioned to sense a first uniform magnetic field of a first polarity and the second bridge can be positioned to sense a second uniform magnetic field of a second polarity opposite to the first polarity, wherein the first uniform magnetic field and the second uniform magnetic field are generated by a common magnetic field source and have equal magnitudes.

In some embodiments, a first electrical signal between the first and second output nodes is indicative of the first uniform magnetic field and a second electrical signal between the third and fourth output nodes is indicative of the second uniform magnetic field. The magnetic field sensor can further include a subtraction element coupled to receive the first electrical signal and the second electrical signal and configured to generate a subtraction signal indicative of a difference between the first electrical signal and the second electrical signal, wherein the subtraction signal is immune to a stray magnetic field and is indicative of the magnitude of the first uniform magnetic field.

In some embodiments, the first output node and the third output node are electrically coupled together and the second output node and the fourth output node are electrically coupled together. The power source can be a current source and a differential current signal between the first output node and the second output node is immune to a stray magnetic field and is indicative of the magnitude of the first uniform magnetic field.

The first uniform magnetic field and the second uniform magnetic field can be generated by a current conductor. The first uniform magnetic field and the second uniform magnetic field can be generated movement of a ferromagnetic object. Each of the first MR element, the second MR element, the third MR element, the fourth MR element, the fifth MR element, the sixth MR element, the seventh MR element, and the eighth MR element can be a TMR element. Either the first MR element, the third MR element, the fifth MR element, and the seventh MR element can be re-pinned to have the first magnetic reference direction or the second MR element, the fourth MR element, the sixth MR element, and the eighth MR element can be re-pinned to have the second magnetic reference direction.

Also described is a magnetic field sensor including a first bridge with a first MR element, a second MR element, a third MR element, and a fourth MR element, wherein the first MR element is coupled between a power source and a first output node, the second MR element is coupled between the power source and a second output node, the third MR element is coupled between the second output node and ground, and the fourth MR element is coupled between the first output node and ground, and further including a second bridge with a fifth MR element, a sixth MR element, a seventh MR element, and an eighth MR element, wherein the fifth MR element is coupled between the power source and a third output node, the sixth MR element is coupled between the power source and a fourth output node, the seventh MR element is coupled between the fourth output node and ground, and the eighth MR element is coupled between the third output node and ground. The first bridge is positioned to sense a first uniform magnetic field of a first polarity and the second bridge is positioned to sense a second uniform magnetic field of a second polarity opposite to the first polarity, wherein the first uniform magnetic field and the second uniform magnetic field are generated by a common magnetic field source and have equal magnitudes.

Features may include one or more of the following individually or in combination with other features. Each of the first MR element, the third MR element, the fifth MR element, and the seventh MR element has a first magnetic reference direction and wherein each of the second MR element, fourth MR element, sixth MR element, and eighth MR element has a second magnetic reference direction opposite to the first magnetic reference direction.

In some embodiments, a first electrical signal between the first and second output nodes is indicative of the first uniform magnetic field and a second electrical signal between the third and fourth output nodes is indicative of the second uniform magnetic field. The magnetic field sensor can further include a subtraction element coupled to receive the first electrical signal and the second electrical signal and configured to generate a subtraction signal indicative of a difference between the first electrical signal and the second electrical signal, wherein the subtraction signal is immune to a stray magnetic field and is indicative of the magnitude of the first uniform magnetic field.

In some embodiments, the first output node and the third output node are electrically coupled together and the second output node and the fourth output node are electrically coupled together. The power source can be a current source and a differential current signal between the first output node and the second output node is immune to a stray magnetic field and is indicative of the magnitude of the first uniform magnetic field.

The first uniform magnetic field and the second uniform magnetic field can be generated by a current conductor. The first uniform magnetic field and the second uniform magnetic field can be generated movement of a ferromagnetic object. Each of the first MR element, the second MR element, the third MR element, the fourth MR element, the fifth MR element, the sixth MR element, the seventh MR element, and the eighth MR element can be a TMR element. Either the first MR element, the third MR element, the fifth MR element, and the seventh MR element can be re-pinned to have the first magnetic reference direction or the second MR element, the fourth MR element, the sixth MR element, and the eighth MR element can be re-pinned to have the second magnetic reference direction.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
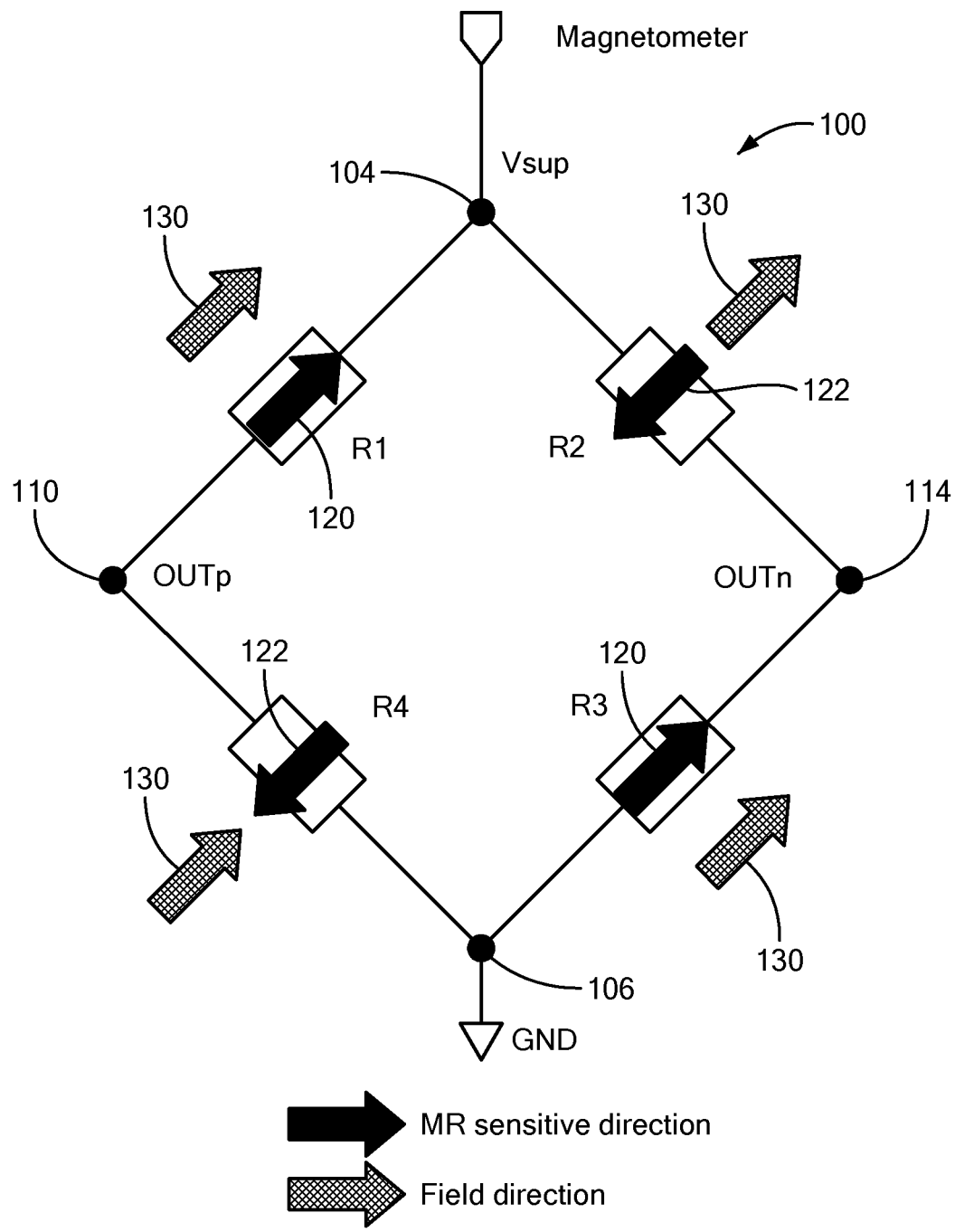
FIG. 1 is an example magnetometer bridge including tunneling magnetoresistance (TMR) elements.

Referring to FIG. 1, a magnetometer bridge circuit 100 includes four magnetoresistance (MR) elements R1, R2, R3, R4 arranged in a bridge configuration. The first MR element R1 is coupled between a positive power source connection 104 and a first output node 110. The second MR element R2 is coupled between the positive power source connection 104 and a second output node 114. The third MR element R3 is coupled between the second output node 114 and a negative power source connection 106. The fourth MR element R4 is coupled between the first output node 110 and the negative power source connection 106. Each MR element R1-R4 can be considered to establish a respective leg of the bridge 100.

The power source connected to the positive and negative connections 104, 106 can take the form of a voltage source or a current source. In embodiments utilizing a voltage source, the positive power source connection 104 can be connected to a Vsup terminal as illustrated, and the negative power source connection 106 can be connected to ground, GND as illustrated. In such a configuration, the resistance of MR elements R1-R4 changes in response to a magnetic field. In embodiments utilizing a current source (e.g., FIG. 6), the positive power source connection 104 can be connected to a source terminal of a current source and the negative power source connection 106 can be connected to a return terminal of the current source. In such a current driven configuration, the conductance of the MR elements changes in response to a magnetic field. Thus, although the power source illustrated in FIG. 1 is a voltage source, the power source could, alternatively, be a current source.

The first output node 110 and the second output node 114 of the bridge 100 are labeled OUTp and OUTn, respectively. It will be appreciated by those of ordinary skill in the art that the output nodes 110, 114 can be voltage output nodes or current output nodes. In other words, a resultant voltage output signal across the first and second output nodes 110, 114 can be proportional to the sensed magnetic field or a resultant current output signal across the first and second output nodes 110, 114 can be proportional to the sensed magnetic field. The monitored parameter can be selected based on linearity with magnetic field. In the illustrated configuration, conductance tends to be more linear than resistance for TMR elements.

Thus, it will be appreciated that there are four possible combinations of supplying the bridge 100 and sensing its output. When the sensing and supplying variables are different (i.e., voltage drive and current sensing or current drive and voltage sensing), the output is not normalized. In some instances, normalization (i.e., driving and sensing the bridge with the same parameter, voltage or current) can be desirable so as to prevent adverse effects of processing and fabrication variations.

As is known by those of ordinary skill in the art, MR elements, such as elements R1-R4, may include a substrate having a reference layer formed thereon. Over the reference layer, a free layer may be formed that is separated from the reference layer by a spacer. Both the reference layer and the free layer are magnetic layers and the layered arrangement of an MR element can be referred to as the MR stack.

The orientation of magnetization of the reference layer is fixed and intended to be co-linear with the field to be sensed, whereas the orientation of magnetization of the free layer will freely align with a magnetic field of the surrounding environment. The resistance of an MR element is proportional to the angle of the of magnetization of the free layer relative to one in the reference layer.

As is shown and described in U.S. Pat. No. 11,346,894, entitled "Current Sensor for Compensation of On-Die Temperature Gradient" which issued on May 31, 2022, and which is hereby incorporated herein by reference, when the free layer and the reference layer have the same orientation of magnetization, the resistance of the MR element is at its highest; whereas when the reference layer and the free layer have opposite orientations of magnetization, the resistance of the MR element is at its lowest. The present disclosure is not limited to any specific implementation of the MR elements.

The term "pinning direction" or "magnetic reference direction" of an MR element refers to the orientation of magnetization of a reference layer (or reference layers) of the MR element. The pinning direction of an MR element determines whether the resistance of the MR element increases or decreases when the MR element is subjected to a magnetic field having a particular orientation, or angle, with respect to such reference layer pinning. In particular, when considering a magnetic field co-linear with the reference layer pinning direction, if the magnetic field opposes the magnetic reference direction, then the resistance of the element increases with an increase in the sensed magnetic field strength; whereas, if the magnetic field is aligned with to the magnetic reference direction, then the resistance of the element decreases with an increase in the magnetic field strength.

The sensitivity of an MR bridge 100 is based on the sensitivity of the MR stacks of elements R1-R4 to stray magnetic fields and is also based on the sensitivity of the bridge configuration itself to stray magnetic fields. Sensitivity of the MR stacks of elements R1-R4 to stray fields is dependent on the stack properties and how robust its parametric behavior can be under the presence of stray magnetic fields. For purposes of this disclosure, the MR stacks of elements R1-R4 are assumed to be stray field immune. Thus, the present disclosure is focused on the sensitivity of the described bridge configurations themselves to stray fields, which sensitivity depends on the way the particular bridge is arranged and the fabrication process quality (i.e., mismatches).

Suitable MR stacks for use in fabricating elements R1-R4 and elements of other bridge configurations herein are described in U.S. Pat. No. 11,346,894, entitled "Current Sensor for Compensation of On-Die Temperature Gradient", issued on May 31, 2022, which is incorporated herein by reference and also in U.S. Pat. No. 11,127,518, entitled "Tunnel Magnetoresistance (TMR) Element having Cobalt Iron and Tantalum Layers", issued on Sep. 21, 2021, which is incorporated herein by reference.

Each of the MR elements R1-R4 has a respective magnetic reference, or pinning direction as indicated by a solid arrow. Thus, MR elements R1 and R3 have a first pinning direction 120 and MR elements R2 and R4 have a second pinning direction 122 opposite with respect to the first pinning direction. Here and elsewhere in the description, by "opposite" pinning directions, it is meant that the pinning directions are 180 degrees apart. It will be appreciated by those of ordinary skill in the art however that alternative implementations are possible in which the opposite pinning directions 120, 122 can differ by less (or more) than 180 degrees. However, for linear differential sensing, the pinning directions 120, 122 should be 180 degrees apart from each other since, otherwise there will be a mismatch in the sensitivity levels of those TMR elements not being at 180 degrees opposite since they will not be co-linear with the applied magnetic field. In other words, in general, for linear sensing with TMR elements, it is advantageous for the applied magnetic field to be co-linear with respect to the pinning directions in order to maximize sensitivities.

Establishing the illustrated magnetic reference directions 120, 122 can require re-pinning of two of the four MR elements R1-R4. This is because the MR elements R1-R4 are fabricated on a single substrate using the same material and process parameters and thus, the resulting MR elements will initially have the same pinning directions. Re-pinning is a process by which the magnetic reference direction of an MR element is changed. Repinning is accomplished at a certain temperature and applied field level and involves "printing" a new magnetic reference on the MR element. Typically, high field strength is required, such as higher than 5000 Gauss. Heating softens the material making it easier to modify and can involve temperatures above 250° C. as can be achieved by either laser or current flow. Applying heat should be local to the MR element being repinned, such that when applying the "printing or pinning field" it only takes effect on the heated element and not the other elements which will also be subjected to a high field strength. Laser pinning achieves local, spatially accurate heating by focusing a laser beam on the TMR element to be repinned. Pinning by the application of current involves forcing a current through the TMR element being repinned to heat it, and thus requires dedicated circuitry for this purpose.

Based on the bridge configuration and magnetic reference directions of the MR elements R1-R4, bridge 100 generates an output signal (e.g., output voltage V=OUTp−OUTn) that varies with variations in the strength of a magnetic field that is uniformly experienced by each of the elements R1-R4.

Stated differently, magnetometer bridge 100 senses a uniform magnetic field across all of the bridge elements R1-R4 and cancels any differential field effects on the elements. This is because a differential field would cause the resistance of elements R3 and R4 to change by the same amount and in the same direction (i.e., increasing resistance or decreasing resistance) and as such, there would not be any change in the bridge output signal as a result of a differential field. By "uniform" it is meant that the sensed field has the same magnitude and direction with respect to all of the elements R1-R4 of the bridge.

In the context of FIG. 1, bridge 100 is configured to sense a uniform magnetic field 130 having a direction shown by a cross-hatched arrow labeled 130. The magnetic field 130 can be referred to as a magnetic field of interest, an applied field, or a sensed field which the bridge 100 is designed to sense. Alternatively or additionally, the magnetic field 130 can be a stray magnetic field from a source other than the source of the magnetic field of interest. Thus, because bridge 100 is configured to sense a magnetic field 130 that is uniform across all of the MR elements R1-R4, bridge 100 is susceptible to stray magnetic fields (which stray fields, by their nature, affect all of the bridge elements in the same direction). Stated differently, bridge 100 is not capable of differentiating between a field of interest and a stray field.

Advantageously however, the sensitivity of the bridge 100 is not modulated by stray magnetic fields as can be understood from the following:

$$\begin{cases} RA = Ro \cdot \left(1 + \dfrac{\overbrace{(S_T + \Delta S_T/2)(B_{in} + B_S)}^{Ideal\ linear\ Stack}}{Ro} + \dfrac{\Delta R_{off}/2}{Ro}\right) \\ RB = Ro \cdot \left(1 + \dfrac{\overbrace{(-S_T + \Delta S_T/2)(B_{in} + B_S)}^{Ideal\ linear\ Stack}}{Ro} - \dfrac{\Delta R_{off}/2}{Ro}\right) \end{cases} \quad (1)$$

where RA is the resistance of elements R1 and R3, RB is the resistance of elements R2 and R4, $S_T$ is the element sensitivity in Ω/G, $\Delta S_T$ is a mismatch in sensitivity with respect to other elements in the bridge, Ro is a nominal resistance of the MR elements when no magnetic field is applied, $\Delta R_{off}$ is the electrical mismatch between elements in the bridge, Bs is a stray magnetic field, and Bin is the intended magnetic field to be sensed. Notably, the sensitivity $S_T$ for elements RA is the opposite polarity than for elements RB because of the re-pinning.

The bridge output voltage $V_{O\_TMR\_M\_VD}$=OUTp–OUTn can be given by:

$$V_{O\_TMR\_M\_VD} = \dfrac{2 \cdot S_T \cdot (B_{in} + B_S) + \Delta R_{off}}{\Delta S_T \cdot (B_{in} + B_S) + 2 \cdot Ro} Vs \quad (2)$$

where Vs is the supply voltage (labelled Vsup in FIG. 1).

In embodiments in which a magnetometer bridge 100 is driven by a current (e.g., FIG. 6) and the bridge output voltage $V_{O\_TMR\_M\_CD}$=OUTp–OUTn can be expressed as follows:

$$V_{O\_TMR\_M\_CD} = (\Delta S_T \cdot (B_{in} + B_S) + 2 \cdot S_T \cdot (B_{in} + B_S) + \Delta R_{off}) \cdot \dfrac{ICC}{2} \quad (3)$$

where Icc is the drive current.

Equations (2) and (3) can be simplified to equations (4) and (5), respectively, by assuming no mismatches and ideally linear stacks. From equations (4) and (5), it can be observed that the sensitivity of the bridge is not modulated by the stray field Bs. Rather, the stray field Bs presents an additive term as follows:

$$V_{O\_TMR\_M\_VD} = S_T/Ro \cdot (B_{in} + B_S) \cdot Vs \quad (4)$$

$$V_{O\_TMR\_M\_CD} = (2 \cdot S_T \cdot (B_{in} + B_S)) \cdot \dfrac{ICC}{2} \quad (5)$$

From the above discussion, it will be appreciated that although magnetometer bridge 100 is not able to differentiate a stray magnetic field from a field of interest, the bridge has the advantageous characteristic of having a sensitivity that is not modulated by a stray field effect. In order to address the additive effect of the stray field Bs, according to the disclosure, two magnetometer bridges of the type shown and described in connection with FIG. 1 can be used in a configuration in which the stray field is presented to the bridges in a differential fashion.

Figure 2:
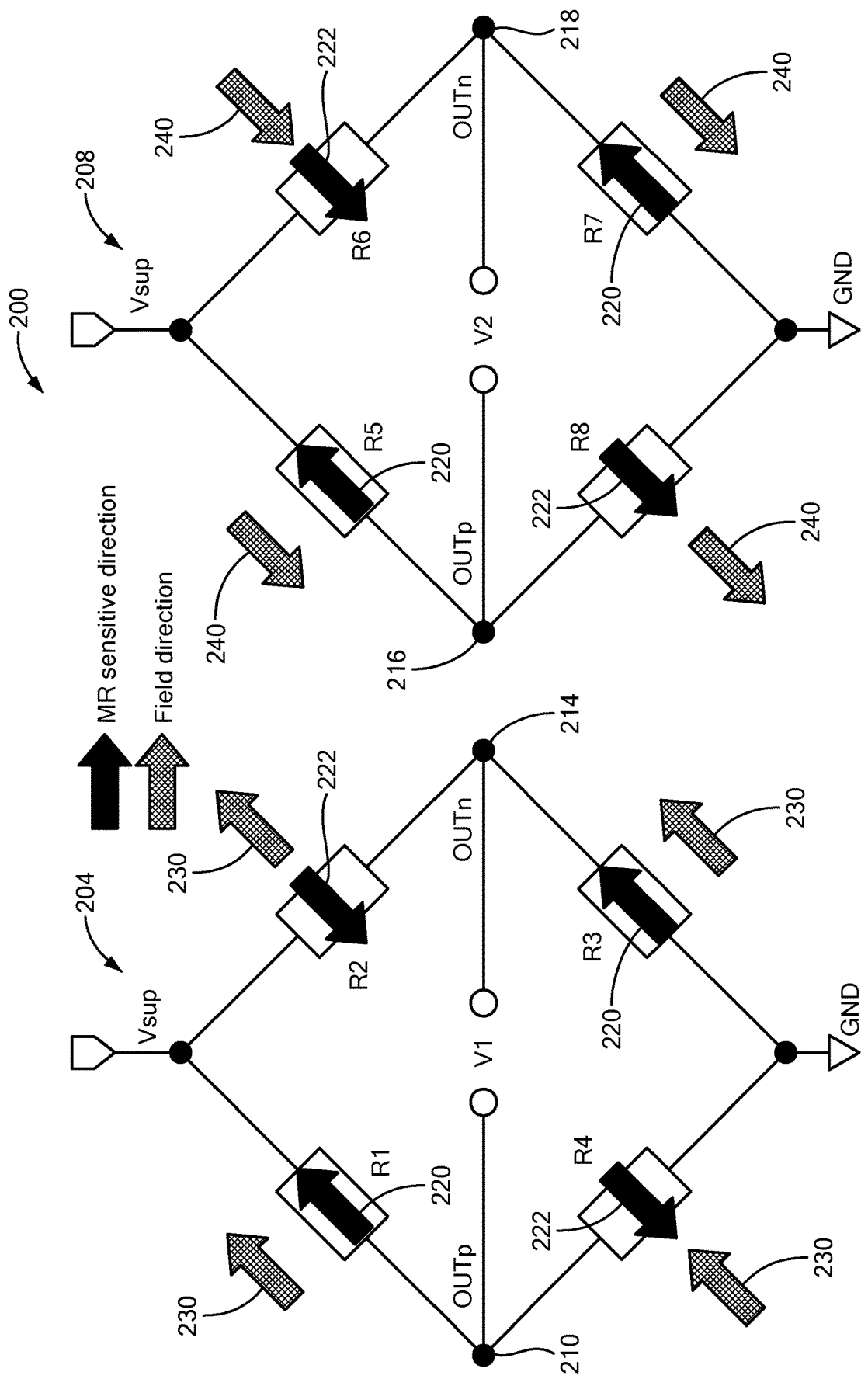
FIG. 2 shows a circuit including two magnetometer bridges, each with TMR elements.

Referring also to FIG. 2, a magnetometer bridge circuit 200 includes two bridge circuits or bridges 204, 208, each of the type shown and described in connection with FIG. 1, but with one such bridge positioned to sense a positive magnetic field and the other bridge positioned to sense a negative magnetic field, according to an aspect of the disclosure. Example applications for the circuit 200 are shown and described in connection with FIGS. 3 and 3A.

First bridge 204 includes a first MR element R1, a second MR element R2, a third MR element R3, and a fourth MR element R4. The first MR element R1 is coupled between a power source Vsup and a first output node 210. The second MR element R2 is coupled between the power source Vsup and a second output node 214. The third MR element R3 is coupled between the second output node 214 and ground. The fourth MR element R4 is coupled between the first output node 210 and ground.

Second bridge 208 includes a fifth MR element R5, a sixth MR element R6, a seventh MR element R7, and an eighth MR element R8. The fifth MR element R5 is coupled between the power source and a third output node 216, the sixth MR element R6 is coupled between the power source and a fourth output node 218, the seventh MR element R7 is coupled between the fourth output node 218 and ground, and the eighth MR element R8 is coupled between the third output node 216 and ground.

Each of the first MR element R1, the third MR element R3, the fifth MR element R5, and the seventh MR element R7 has a first magnetic reference direction labeled 220. Each of the second MR element R2, fourth MR element R4, sixth MR element R6, and eighth MR element R8 has a second magnetic reference direction labeled 222 that is opposite (i.e., 180 degrees difference) with respect to the first magnetic reference direction 220.

In the present example, each of the MR elements R1-R8 is a tunnel magnetoresistive (TMR) element. However alternative implementations are possible in which at least some (or all) of the MR elements R1-R8 can be giant magnetoresistance (GMR) elements or other suitable type of MR element, such as an anisotropic magnetoresistance element (AMR) or magnetic tunnel junction (MTJ).

In order to use the two-bridge circuit 200 to sense a magnetic field of interest in a manner that is immune to stray fields, the bridges 204, 208 are positioned to sense a differential field. To this end, the first bridge 204 is positioned to sense a first uniform magnetic field of a first polarity as illustrated by arrows 230 and the second bridge 208 is positioned to sense a second uniform magnetic field of a second polarity opposite to the first polarity as illustrated by arrows 240, with the first uniform magnetic field and the second uniform magnetic field being generated by a common magnetic field source and having equal magnitudes.

Figure 3:
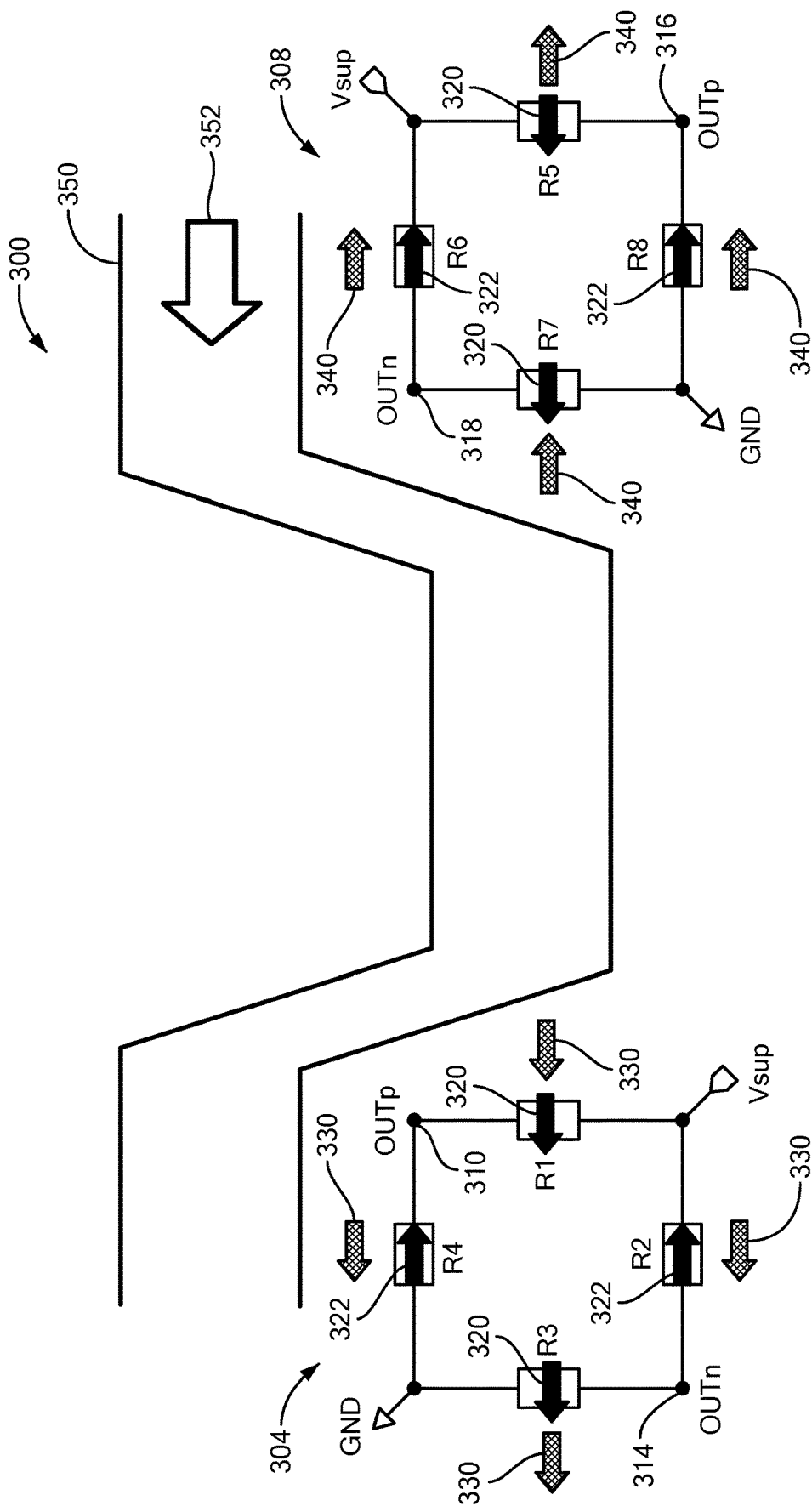
FIG. 3 shows a current sensor configuration including the circuit of FIG. 2.
Figure 3A:
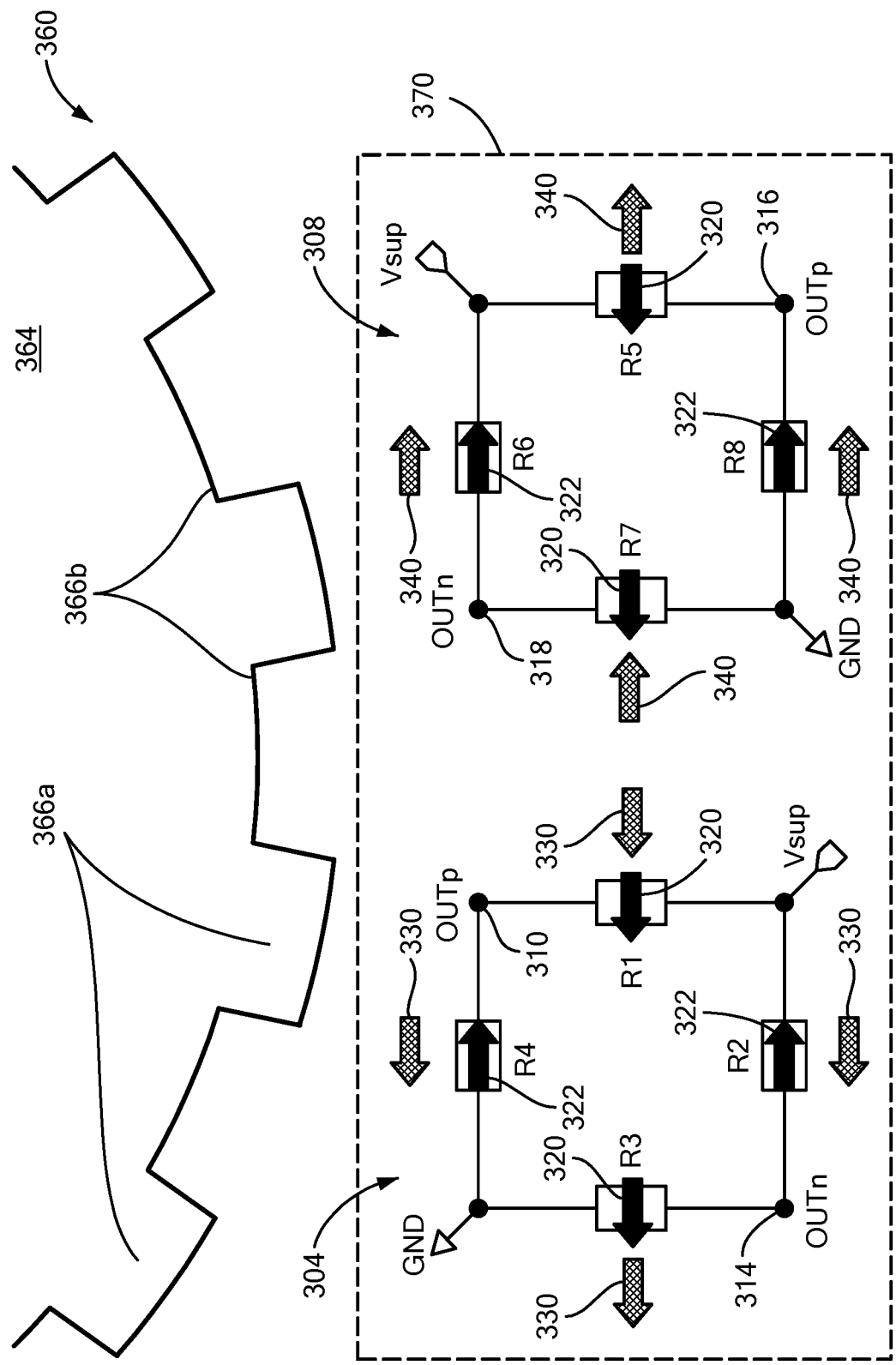
FIG. 3A shows a rotation sensor configuration including the circuit of FIG. 2.

Example magnetic field sources of a differential field including opposite polarity uniform fields like fields 230, 240 are shown in FIGS. 3 and 3A. Suffice it to say here that a first electrical signal V1 between the first and second output nodes 210, 214 is indicative of the first uniform magnetic field 230 and a second electrical signal V2 between the third and fourth output nodes 216, 218 is indicative of the second uniform magnetic field 240.

In use, the output signals V1, V2 from bridges 204, 208, respectively, are processed by circuitry configured to subtract one such output signal from the other. Example circuitry is shown and described in connection with example schematics of FIGS. 8 and 9. The processing circuitry can include a subtraction element coupled to receive the first electrical signal V1 and the second electrical signal V2 and configured to generate a subtraction signal V1-V2 indicative of a difference between the first electrical signal and the second electrical signal. The resulting subtraction signal is indicative of the magnitude of the first uniform magnetic field and is immune to stray magnetic fields.

More particularly, the output voltage V1 of bridge 204 can be represented as follows:

$$V_{O_{TMR_{M1_{VD}}}} = \frac{2 \cdot S_{T\%} \cdot (B_{in} + B_S) + \frac{\Delta R_{off1}}{Ro}}{\Delta S_{T1\%} \cdot (B_{in} + B_S) + 2 \cdot} \cdot Vs \quad (6)$$

where $\Delta S_{T1\%}$ is a percentage (with respect to Ro) mismatch in sensitivity with respect to other elements in the bridge 204 and $\Delta R_{off1}$ is the electrical mismatch between elements in the bridge 204.

And the output voltage V2 of bridge 208 can be represented as follows:

$$V_{O_{TMR_{M2_{VD}}}} = \frac{2 \cdot S_{T\%} \cdot (-B_{in} + B_S) + \frac{\Delta R_{off2}}{Ro}}{\Delta S_{T2\%} \cdot (-B_{in} + B_S) + 2 \cdot} \cdot Vs \quad (7)$$

where $\Delta S_{T2\%}$ is a percentage (with respect to Ro) mismatch in sensitivity with respect to other elements in the bridge 208 and $\Delta R_{off2}$ is the electrical mismatch between elements in the bridge 208. In both expressions $S_{T\%}$ is the common percentage sensitivity of both elements.

The result of subtracting the voltage of equation (7) from the voltage of equation (6) can be represented as follows:

$$V_{O_{TMR_{M1_{VD}}}} - V_{O_{TMR_{M2_{VD}}}} = \frac{\begin{array}{l}2 \cdot S_{T\%} \cdot (\Delta S_{T2\%} - \Delta S_{T1\%}) \cdot (-B_{in}^2 + B_S^2) + \\ 8 \cdot S_{T\%} \cdot B_{in} + (\Delta S_{T2\%} \cdot (-B_{in} + B_S) + 2) \cdot \\ \frac{\Delta R_{off1}}{Ro} - (\Delta S_{T1\%} \cdot (B_{in} + B_S) + 2) \cdot \frac{\Delta R_{off2}}{Ro}\end{array}}{(\Delta S_{T2\%} \cdot \Delta S_{T1\%}) \cdot (-B_{in}^2 + B_S^2) + 2 \cdot \Delta S_{T2\%} \cdot \\ (-B_{in} + B_S) + 2 \cdot \Delta S_{T1\%} \cdot (B_{in} + B_S) + 4}$$

In particular when considering the same unbalances on both bridges, i.e.

$$\Delta S_{T1\%} = \Delta S_{T2\%} = \Delta S_{T\%} \text{ and } \frac{\Delta R_{off1}}{Ro} = \frac{\Delta R_{off2}}{Ro} = \frac{\Delta R_{off}}{Ro} \quad (8)$$

$$V_{O_{TMR_{M1_{VD}}}} - V_{O_{TMR_{M2_{VD}}}} = \frac{8 \cdot S_{T\%} \cdot B_{in} - 2 \cdot \Delta S_{T\%} \cdot B_{in} \cdot \frac{\Delta R_{off}}{Ro}}{\Delta S_{T\%}^2 \cdot (-B_{in}^2 + B_S^2) + 4 \cdot \Delta S_{T\%} \cdot B_S + +4} \cdot Vs$$

$$V_{O_{TMR_{M1_{VD}}}} - V_{O_{TMR_{M2_{VD}}}} = \frac{8 \cdot S_{T\%} \cdot B_{in} - 2 \cdot \Delta S_{T\%} \cdot B_{in} \cdot \frac{\Delta R_{off}}{Ro}}{\Delta S_{T\%}^2 \cdot (-B_{in}^2 + B_S^2) + 4 \cdot \Delta S_{T\%} \cdot B_S + 4} \cdot Vs$$

Consideration of equation (8) reveals that stray field immunity (for stray field co-linear with the pinning reference) depends mostly on the difference between element sensitivity mismatches $\Delta S_{T1}$ in one bridge 204 versus element sensitivity mismatches $\Delta S_{T2}$ in the other bridge 208 (i.e., $\Delta S_{T1} - \Delta S_{T2}$). If mismatches are the same on both bridges (although different from zero), the modulation of the output voltage as a function of the stray field is very weak (considering the squared term in the denominator). As such, the two bridge circuit 200 of FIG. 2 has an advantage (e.g., as compared to a single bridge solution like bridge 100 of FIG. 1) that it has additional robustness against stray fields. Further, the electrical offset mismatch also depends on how different the imbalances are between the bridges 204, 208 (i.e., $\Delta R_{off1} - \Delta R_{off2}$). Stated differently, use of the two bridge circuit 200 does not require zero mismatch (sensitivity or electrical offset) to achieve stray field rejection; but rather it is desired to have similar mismatches within each of the bridges 204, 208. In other words, in a single bridge (e.g., bridge 100 of FIG. 1), mismatches between elements R1-R4 within the bridge affects the bridge output voltage; whereas with two bridges (e.g., circuit 200 of FIG. 2), it is only the relative mismatch difference between the two bridges 204, 208 that mainly affects the output voltage.

Referring also to FIG. 3, a current sensor 300 includes a current conductor 350 and bridge circuits 304, 308. The current conductor 350 is configured to carry a current illustrated by arrow 352. The current 352 generates a magnetic field that is sensed by bridges 304, 308, which bridges can be the same as or similar to bridges 204, 208 of FIG. 2. To this end, bridge 304 includes a first MR element R1, a second MR element R2, a third MR element R3, and a fourth MR element R4. The first MR element R1 is coupled between a power source Vsup and a first output node 310. The second MR element R2 is coupled between the power source Vsup and a second output node 314. The third MR element R3 is coupled between the second output node 314 and ground. The fourth MR element R4 is coupled between the first output node 310 and ground. Second bridge 308 includes a fifth MR element R5, a sixth MR element R6, a seventh MR element R7, and an eighth MR element R8. The fifth MR element R5 is coupled between the power source and a third output node 316, the sixth MR element R6 is coupled between the power source and a fourth output node 318, the seventh MR element R7 is coupled between the fourth output node 318 and ground, and the eighth MR element R8 is coupled between the third output node 316 and ground.

Each of the first MR element R1, the third MR element R3, the fifth MR element R5, and the seventh MR element R7 has a first magnetic reference direction labeled 320. Each of the second MR element R2, fourth MR element R4, sixth MR element R6, and eighth MR element R8 has a second magnetic reference direction labeled 322 that is opposite (i.e., 180 degrees difference) with respect to the first magnetic reference direction 320. In the present example, each of the MR elements R1-R8 is a TMR element; however, alternative sensing element types are possible.

Bridges 304, 308 are positioned to sense the field of interest generated by the current 352 in a differential manner. In particular, bridge 304 is positioned to sense a uniform magnetic field illustrated by arrows 330 (that can be the same as or similar to magnetic field 230) and bridge 308 is positioned to sense a uniform magnetic field illustrated by arrows 340 (that can be the same as or similar to magnetic field 240), which uniform magnetic fields 330, 340 have opposite polarities and equal magnitudes. The magnitude of the fields 330, 340 are equal since such fields are generated by a common source; namely, the current 352 through the conductor. The opposite polarities of fields 330, 340 are achieved by the design of the conductor 350 and positioning of the bridges 304, 308 relative to the conductor.

The orientation of the bridge elements R1-R8 with respect to the conductor 350 is such that the magnetic field generated by the current 352 has a component parallel to the axis of maximum sensitivity, which axis of maximum sensitivity for MR elements R1-R8 is parallel to a substrate or in the plane of the substrate that supports the magnetic field sensing element.

Various physical configurations are possible for implementing the current sensor 300. For example, the current sensor 300 including bridges 304, 308 can be provided in the form of an integrated circuit (IC) with the conductor 350 integral to the integrated circuit package (i.e., the conductor can be formed within the same IC package, for example in the form of a bus bar or current trace). Alternatively however, the conductor 350 can be external with respect to the current sensor IC package that contains the bridges 304, 308 and optionally also processing circuitry.

Bridges 304, 308 can be fabricated on single or multiple substrates, such as semiconductor die, to support the MR elements R1-R8 and optionally also processing circuitry. For example, bridges 304, 308 can be fabricated on a single substrate (e.g., semiconductor die) in a single IC package or alternatively can be fabricated on separate substrates in one or more IC packages.

The bridges 304, 308 can be positioned relative to the conductor 350 in different ways depending on the particular application, as long as the uniform fields 330, 340 that make up the magnetic field intended to be sensed are experienced by the MR sensing elements R1-R8 with a directional component aligned with the axis of maximum sensitivity (i.e., such that the MR elements R1-R8 sense an in-plane differential component).

Referring also to FIG. 3A, a rotation sensor system 360 includes a target 364 and a sensor 370. The sensor 370 includes bridges 304, 308, which bridges are as described above. The target 364 can take various forms, such as the illustrated rotatable gear having features including teeth 366a and valleys 366b, or a ring magnet having magnetic domains of alternating polarities. For example, gear 364 can be ferromagnetic and can be positioned proximate to a permanent magnet (not shown) such that fluctuations in the magnetic field occur based on movement of the gear in a so-called "back bias" arrangement.

Movement (e.g., rotation) of the target 364 generates a magnetic field that includes a first uniform field 330 to which one of the bridges 304 is subjected and a second uniform field 340 to which the other one of the bridges 308 is subjected. The first and second uniform fields 330, 340 have opposite polarities with respect to each other, as illustrated by arrows 330, 340 having directions separated by 180 degrees.

Thus, bridges 304, 308 are positioned to sense a field of interest that is based on and indicative of motion of the target 364 in a differential manner. In particular, bridge 304 is positioned to sense a uniform magnetic field illustrated by arrows 330 (that can be the same as or similar to magnetic field 230) and bridge 308 is positioned to sense a uniform magnetic field illustrated by arrows 340 (that can be the same as or similar to magnetic field 240), which uniform magnetic fields 330, 340 have opposite polarities and equal magnitudes. In the rotation sensor 360 of FIG. 3A, the opposite polarities of fields 330, 340 are achieved by movement of the target 364 past the sensor such that bridge 304 is positioned to experience the field direction 330 while bridge 308 is positioned to experience the field direction 340. In particular, the sensor die can be aligned with the rotating target and the bridges 304, 308 can be spaced from each other by a distance that is based on a size and spacing of the target features 366a, 366b (i.e., size of a tooth-valley pair with respect to spacing between bridges). The orientation of the bridge elements R1-R8 with respect to the target 364 is such that the magnetic field associated with movement of the target has a component parallel to the axis of maximum sensitivity, which axis of maximum sensitivity for MR elements R1-R8 is parallel to a substrate or in the plane of the substrate that supports the magnetic field sensing element. The magnitudes of the fields 330, 340 are equal since such fields are generated by a common source; namely, by movement of the target 364.

Various physical configurations are possible for implementing the rotation sensor system 360. Sensor 370 including bridges 304, 308 can be provided in the form of an integrated circuit containing a single or multiple substrates, such as semiconductor die, to support the MR elements R1-R8 and optionally also processing circuitry. For example, bridges 304, 308 can be fabricated on a single substrate (e.g., semiconductor die) in a single IC package or alternatively can be fabricated on separate substrates in one or more IC packages.

The sensor IC 370 can be positioned relative to the target 364 in different ways depending on the particular application as long as the uniform fields 330, 340 that make up the magnetic field intended to be sensed are experienced by the MR sensing elements R1-R8 with a directional component aligned with the plane of sensitivity. For example, although illustrated as a plan view, the sensor IC 370 can be rotated by ninety degrees so that the sensed magnetic fields 330, 340 are in-plane with the major surface of the semiconductor die. Further such sensor IC 370 can be rotated by ninety degrees out of the plane of the page so that one bridge 304 is closer to the target 364 than the other bridge 308. In general, the sensed fields 330, 340 should be opposite to each other and in-plane with respect to the sensor die.

Figure 4:
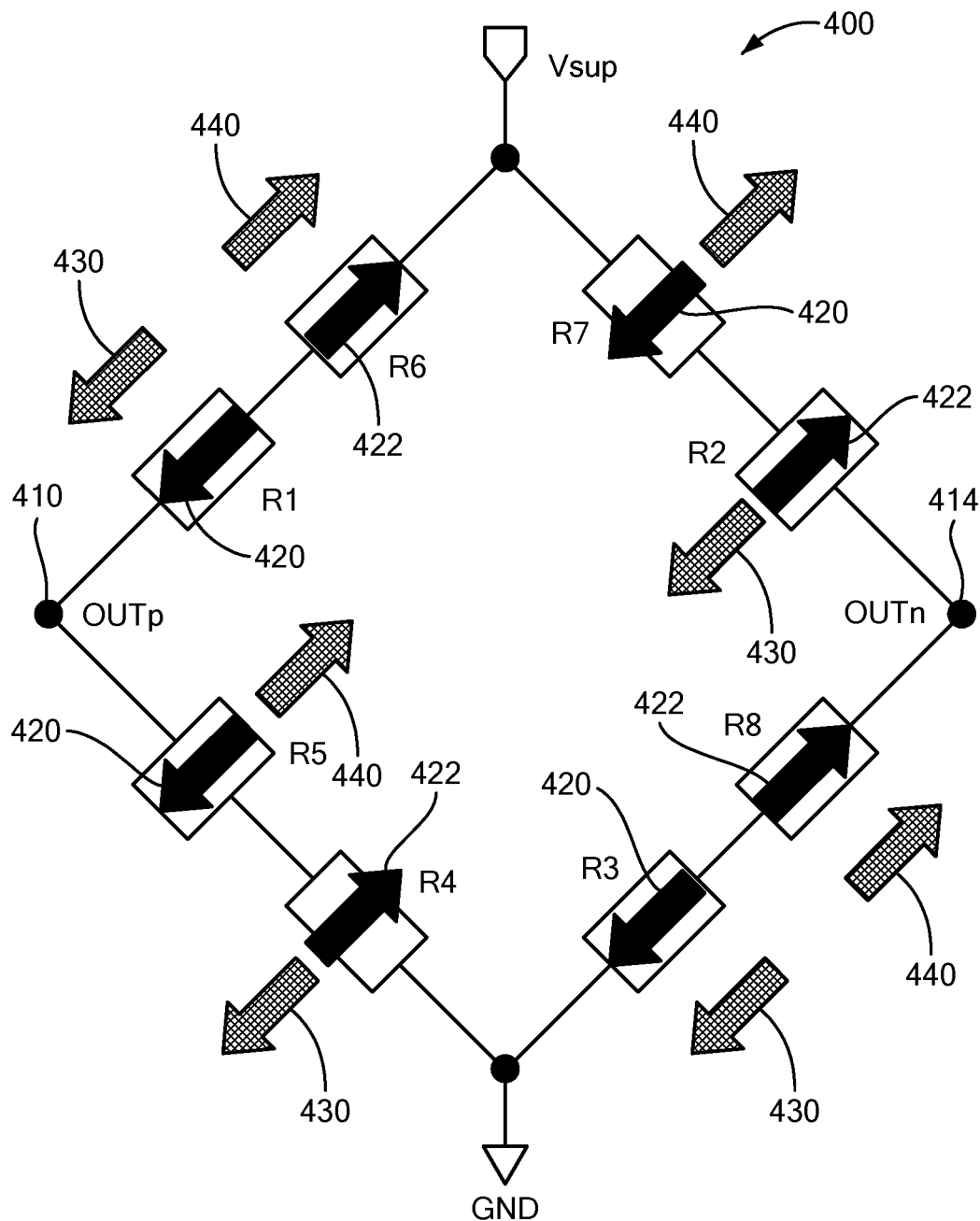
FIG. 4 shows a circuit including a composite magnetometer bridge, with elements from each bridge connected in series.

Referring also to FIG. 4, an alternative bridge circuit 400 can include a composite bridge arrangement including eight MR elements R1-R8. Bridge 400 includes a first MR element R1 and a sixth MR element R6 coupled in series to form a first bridge leg between a power source Vsup and a first output node 410, a second MR element R2 and a seventh MR element R7 coupled in series to form a second bridge leg between the power source Vsup and a second output node 414, a third MR element R3 and an eighth MR element R8 coupled in series to form a third bridge leg between the second output node 414 and ground, and a fourth MR element R4 and a fifth MR element R5 coupled in series to for a fourth bridge leg between the first output node 410 and ground, as shown.

Each of the first MR element R1, the third MR element R3, the fifth MR element R5, and the seventh MR element R7 has a first magnetic reference direction labeled 420. Each of the second MR element R2, fourth MR element R4, sixth MR element R6, and eighth MR element R8 has a second magnetic reference direction labeled 422 that is opposite (i.e., 180 degrees difference) with respect to the first magnetic reference direction 420. Thus, within each leg of bridge 400, the MR elements have different opposite pinning directions with respect to each other. In the present example, each of the MR elements R1-R8 is a TMR element; however, alternative sensing element types are possible.

The bridge 400 is configured to sense a differential field of interest made up of a first uniform field as indicated by arrows labeled 430 and a second uniform field as indicated by arrows labeled 440 in a manner that rejects stray fields as may affect the bridge elements R1-R8. More particularly, bridge elements R1-R4 are positioned to sense the first uniform magnetic field of a first polarity 430 and bridge elements R5-R8 are positioned to sense a second uniform magnetic field of a second polarity 440 opposite to the first polarity, with the first uniform magnetic field and the second uniform magnetic field being generated by a common magnetic field source and having equal magnitudes.

The bridge circuit 400 can be described as a series-combined, or composite bridge configuration and requires only a single signal processing path unlike the bridge circuit 200 of FIG. 2 that requires two signal processing paths, thereby saving power and area. This is because the single output signal across nodes 410, 414 has the subtraction operation (e.g., the subtraction of output signal V2 from V1 in FIG. 2) already implemented by the electrical connections of the elements within the bridge.

Figure 5:
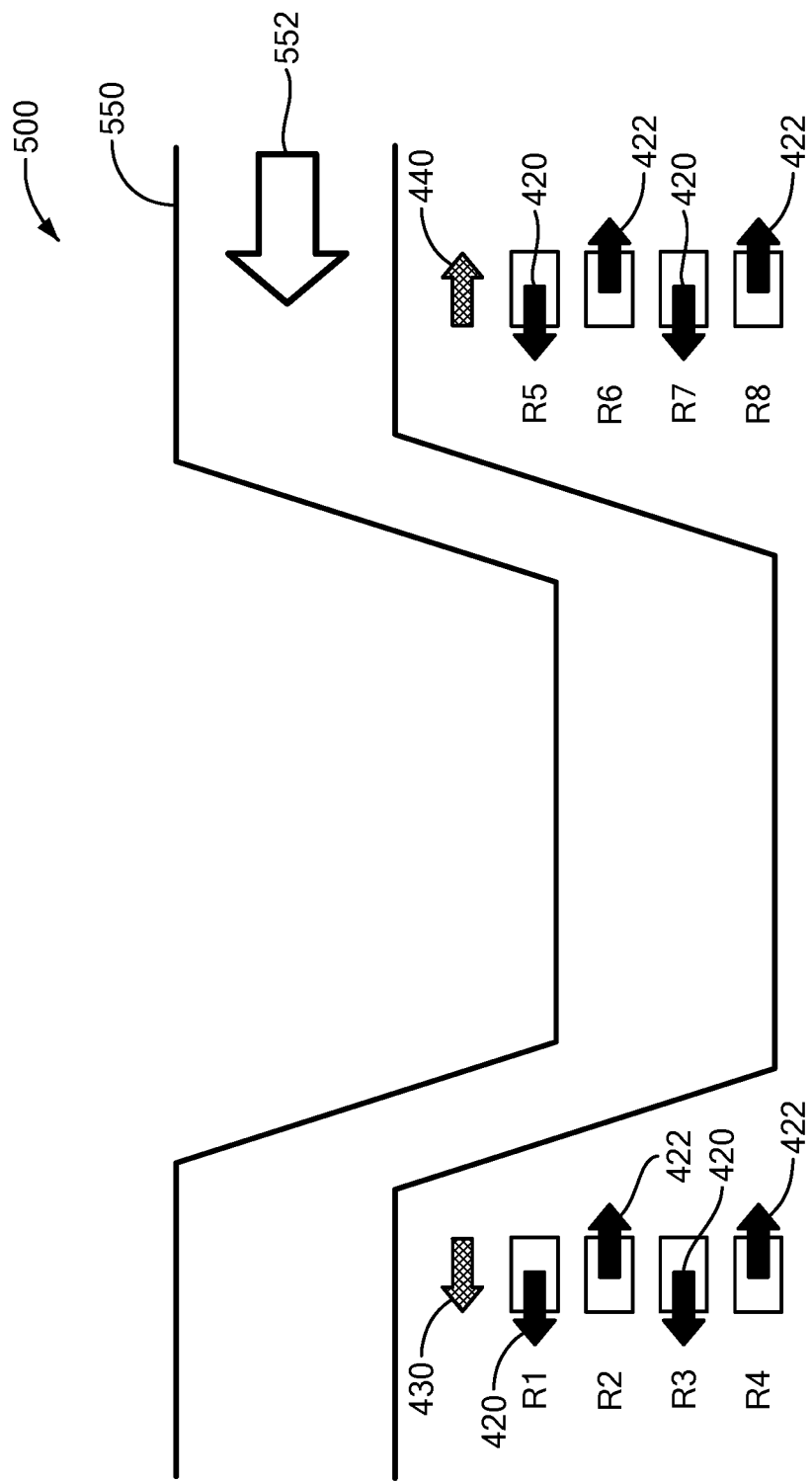
FIG. 5 shows a current sensor configuration including the circuit of FIG. 4.
Figure 5A:
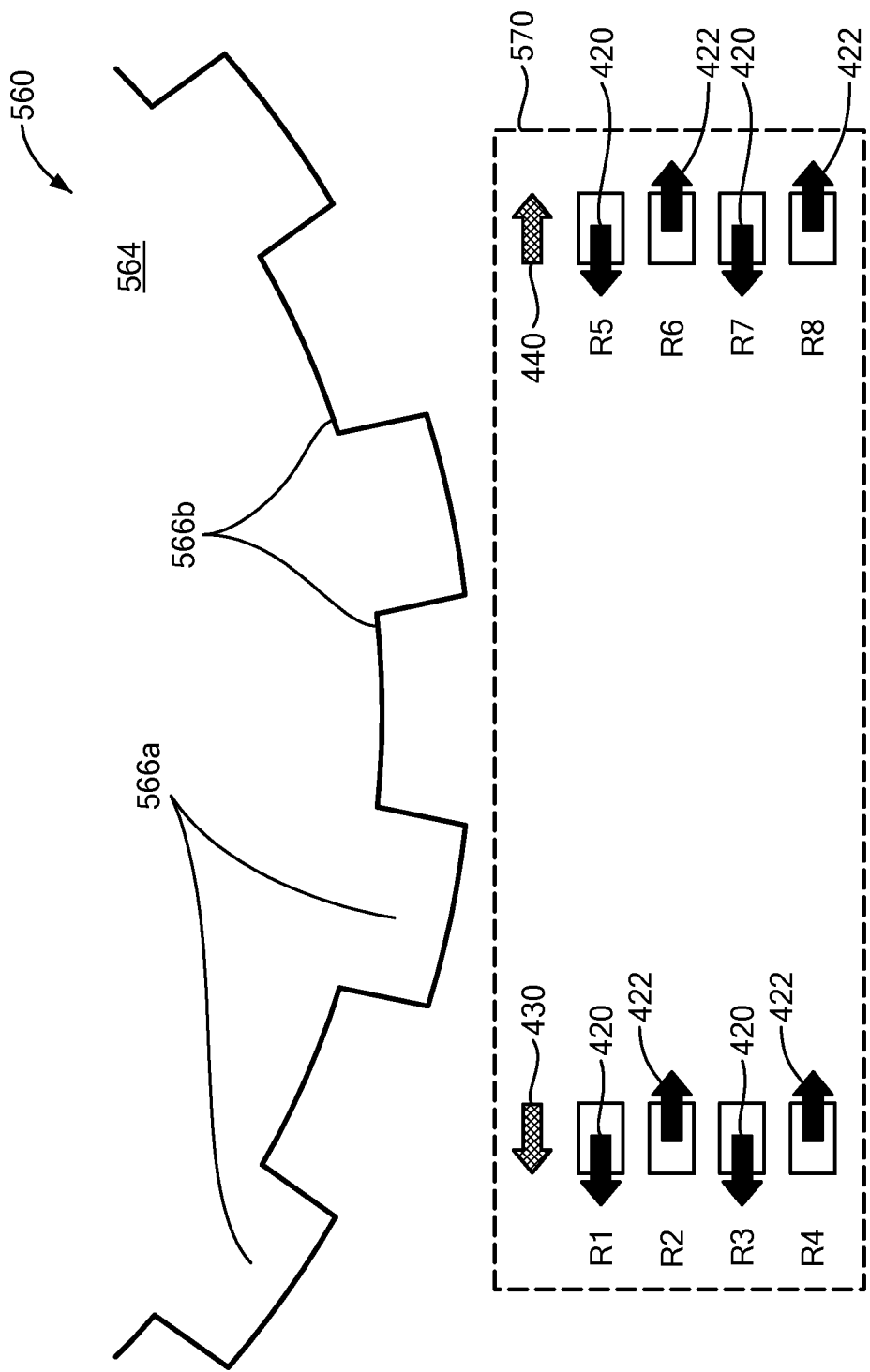
FIG. 5A shows a rotation sensor configuration including the circuit of FIG. 4.

Referring also to FIGS. 5 and 5A, possible application circuits for use with the composite series-combined bridge circuit 400 of FIG. 4 include a current sensor 500 and rotation sensor 560, respectively.

FIG. 5 shows a current sensor 500 that can be the same as or similar to current sensor 300 of FIG. 3 and thus includes a current conductor 550 configured to carry a current illustrated by arrow 552. The current 552 generates a magnetic field that is sensed by bridge 400 of FIG. 4, which bridge includes MR elements R1-R8 positioned and with magnetic reference directions as shown.

MR elements R1-R8 are positioned to sense the field of interest generated by the current 552 in a differential manner. In particular, bridge elements R1-R4 are positioned to sense a uniform magnetic field illustrated by arrows 430 (that can be the same as or similar to magnetic field 230 or 330) and bridge elements R5-R8 are positioned to sense a uniform magnetic field illustrated by arrows 440 (that can be the same as or similar to magnetic field 240 or 340), which uniform magnetic fields 430, 440 have opposite polarities and equal magnitudes.

Electrical connections of the MR elements R1-R8 are as shown in FIG. 4 and the physical configuration of the MR elements can be designed to suit the particular application as explained above in connection with the current sensor 300 of FIG. 3.

FIG. 5A shows a rotation sensor 560 that can be the same as or similar to rotation sensor 360 of FIG. 3A and thus includes target 364. Rotation of target 364 generates a magnetic field that is sensed by bridge 400 of FIG. 4, which bridge includes MR elements R1-R8 positioned and with magnetic reference directions as shown.

MR elements R1-R8 are positioned to sense the field of interest generated rotation of target 364 in a differential manner. In particular, bridge elements R1-R4 are positioned to sense a uniform magnetic field illustrated by arrows 430 (that can be the same as or similar to magnetic field 230 or 330) and bridge elements R5-R8 are positioned to sense a uniform magnetic field illustrated by arrows 440 (that can be the same as or similar to magnetic field 240 or 340), which uniform magnetic fields 430, 440 have opposite polarities and equal magnitudes.

Electrical connections of the MR elements R1-R8 are as shown in FIG. 4 and the physical configuration of the MR elements can be designed to suit the particular application as explained above in connection with the rotation sensor 360 of FIG. 3A.

Figure 6:
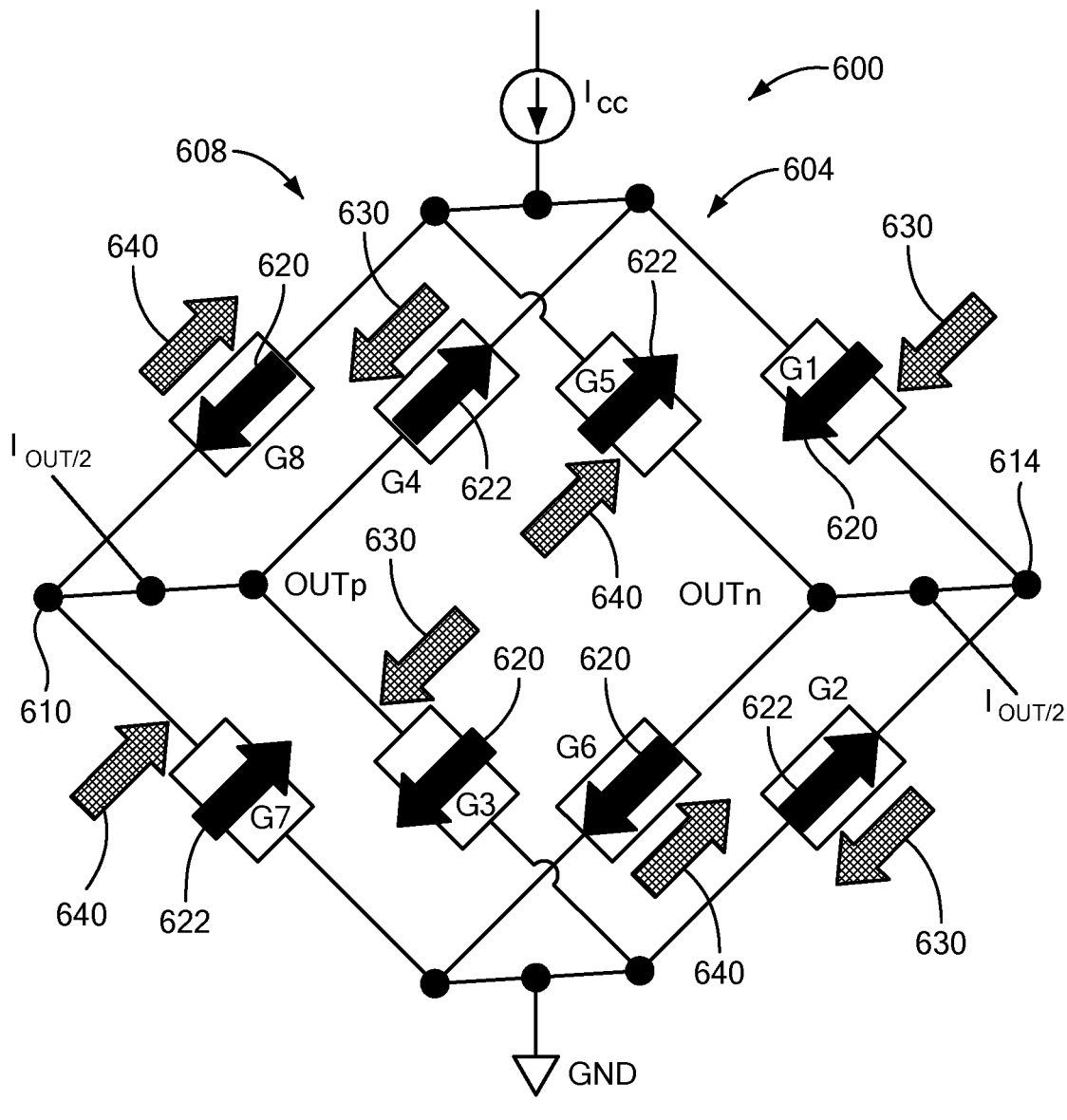
FIG. 6 shows another circuit including two magnetometer bridges, each with TMR elements, and with the two bridges connected in parallel.

Referring also to FIG. 6, an alternative bridge circuit 600 includes two bridges having their supply and output connections electrically coupled together so that the bridges are coupled in parallel, as shown. In the embodiment of FIG. 6, the bridge circuit 600 is supplied by a current source Icc and thus, it is the conductance of the MR elements that changes with a changing magnetic field rather than the resistance. For this reason, MR elements in FIG. 6 are labeled G1-G8 (i.e., rather than R1-R8) to denote that it is the conductance that varies. Further, the output signal of bridge 600 taken across output nodes 610, 614 is a current signal.

Bridge circuit 600 includes a first bridge 604 having MR elements G1-G4 and a second bridge 609 having MR elements G5-G8. More particularly, the first bridge 604 includes a first MR element G1, a second MR element G2, a third MR element G3, and a fourth MR element G4. The first MR element G1 is coupled between current source Icc and a first output node 610. The second MR element G2 is coupled between current source Icc and a second output node 614. The third MR element G3 is coupled between the second output node 614 and ground. The fourth MR element G4 is coupled between the first output node 610 and ground.

Second bridge 608 includes a fifth MR element G5, a sixth MR element G6, a seventh MR element G7, and an eighth MR element G8. The fifth MR element G5 is coupled between current source Icc and a third output node 616, the sixth MR element G6 is coupled between current source Icc and a fourth output node 618, the seventh MR element G7 is coupled between the fourth output node 618 and ground, and the eighth MR element G8 is coupled between the third output node 616 and ground.

Each of the first MR element G1, the third MR element G3, the sixth MR element G6, and the eighth MR element G8 has a first magnetic reference direction labeled 620. Each of the second MR element G2, fourth MR element G4, fifth MR element G5, and seventh MR element G7 has a second magnetic reference direction labeled 622 that is opposite (i.e., 180 degrees difference) with respect to the first magnetic reference direction 620.

In the present example, each of the MR elements G1-G8 is a tunnel magnetoresistive (TMR) element. However alternative implementations are possible in which at least some (or all) of the MR elements G1-G8 can be giant magnetoresistance (GMR) elements or other suitable type of MR element, such as an anisotropic magnetoresistance element (AMR).

The output current signal Iout bridge 600 taken across nodes 610, 614 (i.e., OUTp–OUTn) can be expressed as follows:

$$Iout = \frac{I_{cc}}{2} \frac{(G_A - G_B)}{(G_A + G_B)} \quad (9)$$

where $G_A$ is the summation of the conductance of parallel coupled elements G1 and G5 which is equal to the summation of the conductance of parallel coupled elements G3 and G7 and GB is the summation of the conductance of parallel coupled elements G2 and G6 which is equal to the summation of the conductance of parallel coupled elements G4 and G8.

Figure 7:
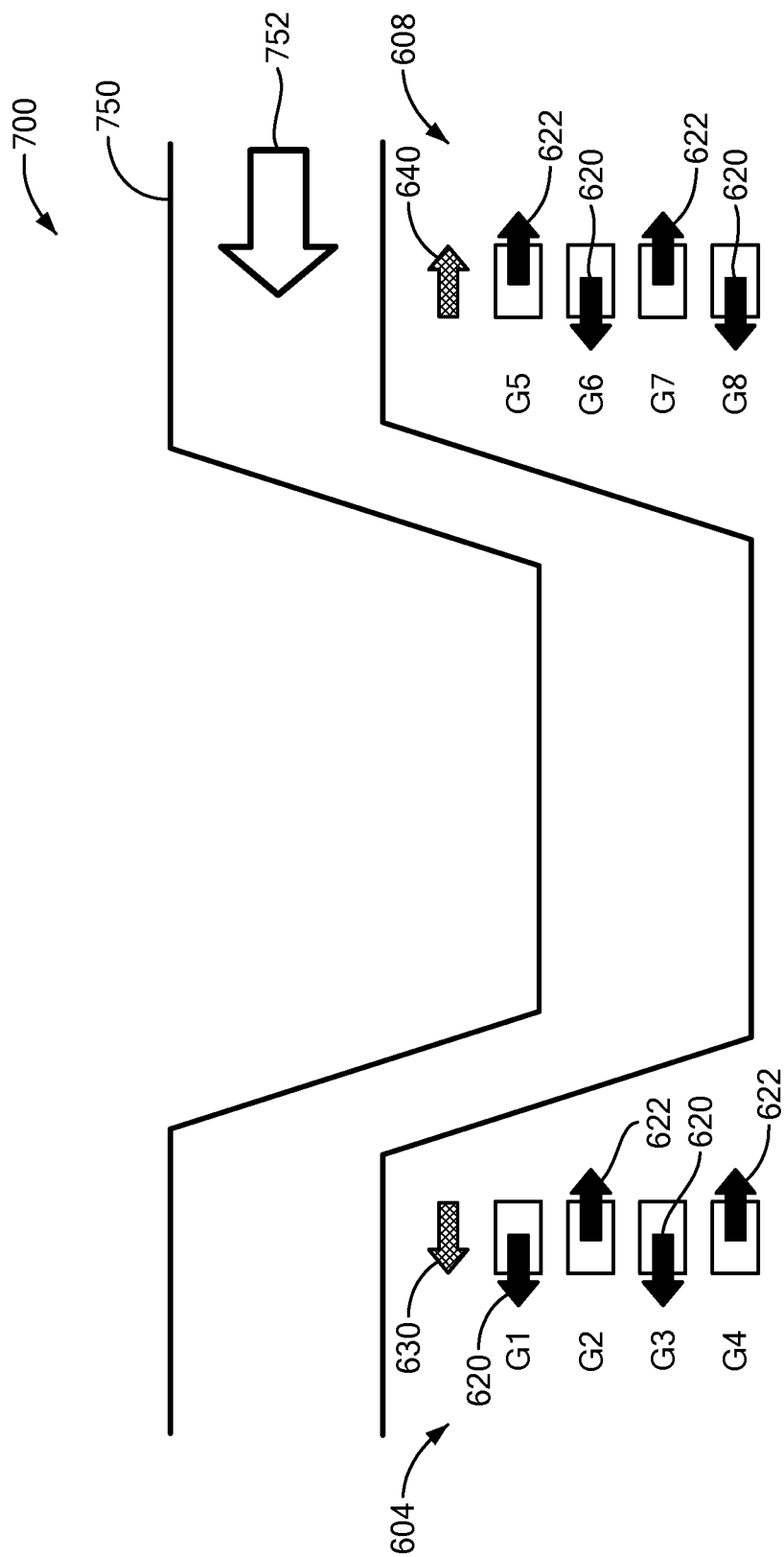
FIG. 7 shows a current sensor configuration including the circuit of FIG. 6.
Figure 7A:
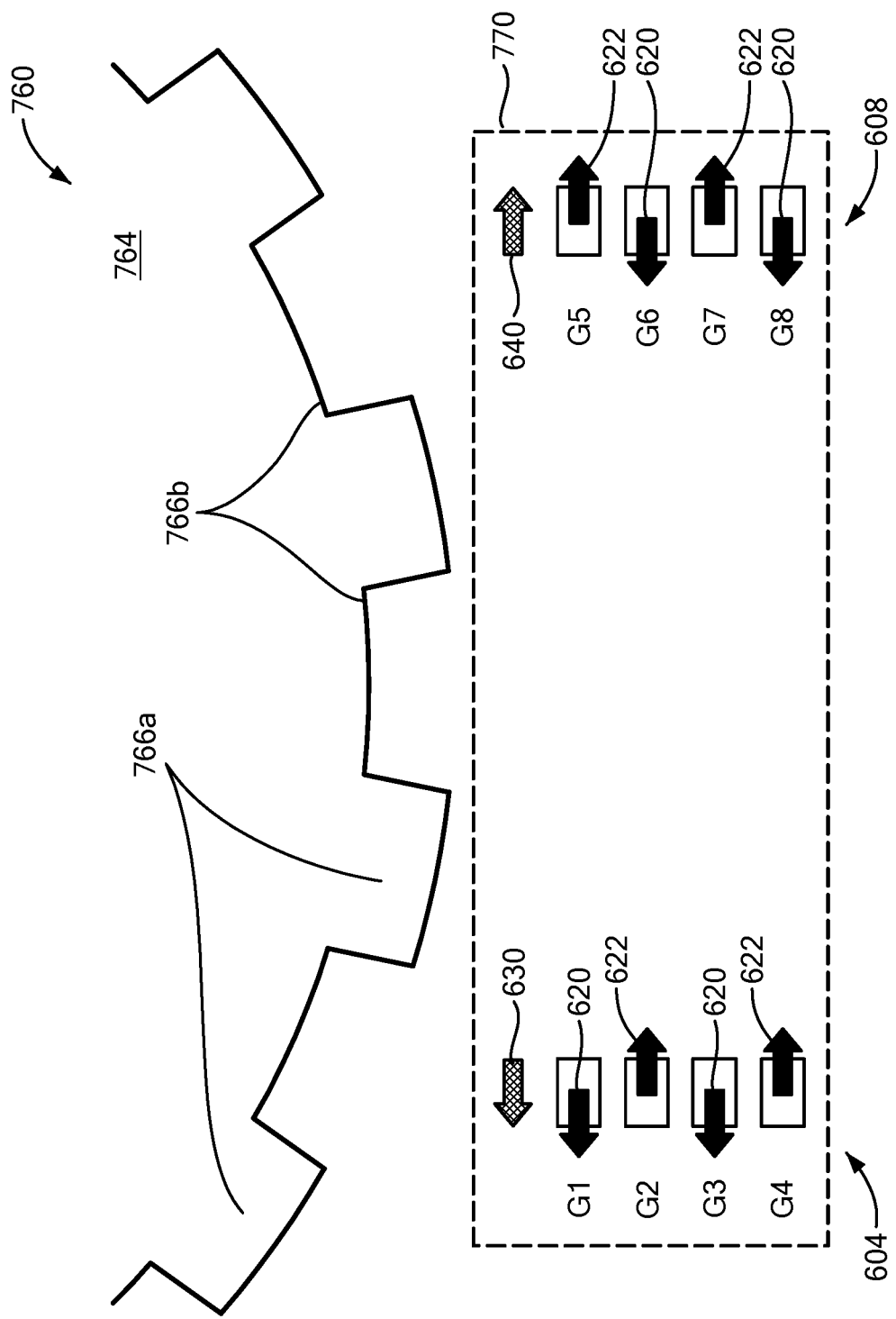
FIG. 7A shows a rotation sensor configuration including the circuit of FIG. 6.

In order to use the parallel bridge circuit 600 to sense a magnetic field of interest in a manner that is immune to stray fields, bridges 604, 608 are positioned to sense a differential field of interest. To this end, the first bridge 604 is positioned to sense a first uniform magnetic field of a first polarity as illustrated by arrows 630 and the second bridge 608 is positioned to sense a second uniform magnetic field of a second polarity opposite to the first polarity as illustrated by arrows 640, with the first uniform magnetic field and the second uniform magnetic field being generated by a common magnetic field source and having equal magnitudes. Example magnetic field sources of a differential field including opposite polarity uniform fields like fields 630, 640 are shown in FIGS. 7 and 7A.

Advantageously, bridge circuit 600 with its single output signal across nodes 610, 614 requires only a single signal processing path unlike the bridge circuit 200 of FIG. 2 that requires two signal processing paths, thereby saving power and area.

Further, bridge circuit 600 can achieve increased linearity, for example as compared to the bridge configuration 400 (FIG. 4). This is because, for the same unit cell nominal resistance of the MR elements, the bridge circuit 600 will have 2× smaller thermal noise than bridge circuit 400, thereby increasing the signal-to-noise ratio (SNR) of the sensor.

Even further linearity improvement is achieved because bridge circuit 600 is driven with a current Icc and the output signal across nodes 610, 614 is a current. This power source and sensing combination with this parallel bridge configuration achieves further improved linearity because each of the legs of bridge 600 includes parallel coupled TMR elements (i.e., elements G1 and G5, elements G2 and G6, elements G3 and G7, and elements G4 and G8) and the conductance of such elements in each such pair are summed and for TMR, conductance behaves more linear than resistance with respect to the magnetic field for an individual stack. Thus, the overall response of bridge 600 with its input current source and output current sense and summed conductance in each bridge leg achieve better linearity as compared to the series-combined bridge 400 of FIG. 4 for example.

Referring also to FIGS. 7 and 7A, possible application circuits for use with the parallel bridge circuit 600 of FIG. 6 include a current sensor 700 and rotation sensor 760, respectively.

FIG. 7 shows a current sensor 700 that can be the same as or similar to current sensor 300 of FIG. 3 and thus includes a current conductor 750 configured to carry a current illustrated by arrow 752. The current 752 generates a magnetic field that is sensed by bridge 600 of FIG. 6, which bridge includes MR elements G1-G8 positioned and with magnetic reference directions as shown.

MR elements G1-G8 are positioned to sense the field of interest generated by the current 752 in a differential manner. In particular, bridge elements G1-G4 are positioned to sense a uniform magnetic field illustrated by arrows 630 (that can be the same as or similar to magnetic field 230 or 330) and bridge elements G5-G8 are positioned to sense a uniform magnetic field illustrated by arrows 640 (that can be the same as or similar to magnetic field 240 or 340), which uniform magnetic fields 630, 640 have opposite polarities and equal magnitudes.

Electrical connections of the MR elements G1-G8 are as shown in FIG. 6 and the physical configuration of the MR elements can be designed to suit the particular application as explained above in connection with the current sensor 300 of FIG. 3.

FIG. 7A shows a rotation sensor 760 that can be the same as or similar to rotation sensor 360 of FIG. 3A and thus includes target 764. Rotation of target 764 generates a magnetic field that is sensed by bridge 600 of FIG. 6, which bridge includes MR elements G1-G8 positioned and with magnetic reference directions as shown.

MR elements G1-G8 are positioned to sense the field of interest generated rotation of target 764 in a differential manner. In particular, bridge elements G1-G4 are positioned to sense a uniform magnetic field illustrated by arrows 630 (that can be the same as or similar to magnetic field 230 or 330) and bridge elements G5-G8 are positioned to sense a uniform magnetic field illustrated by arrows 640 (that can be the same as or similar to magnetic field 240 or 340), which uniform magnetic fields 630, 640 have opposite polarities and equal magnitudes.

Electrical connections of the MR elements G1-G8 are as shown in FIG. 6 and the physical configuration of the MR elements can be designed to suit the particular application as explained above in connection with the rotation sensor 360 of FIG. 3A.

Figure 8:
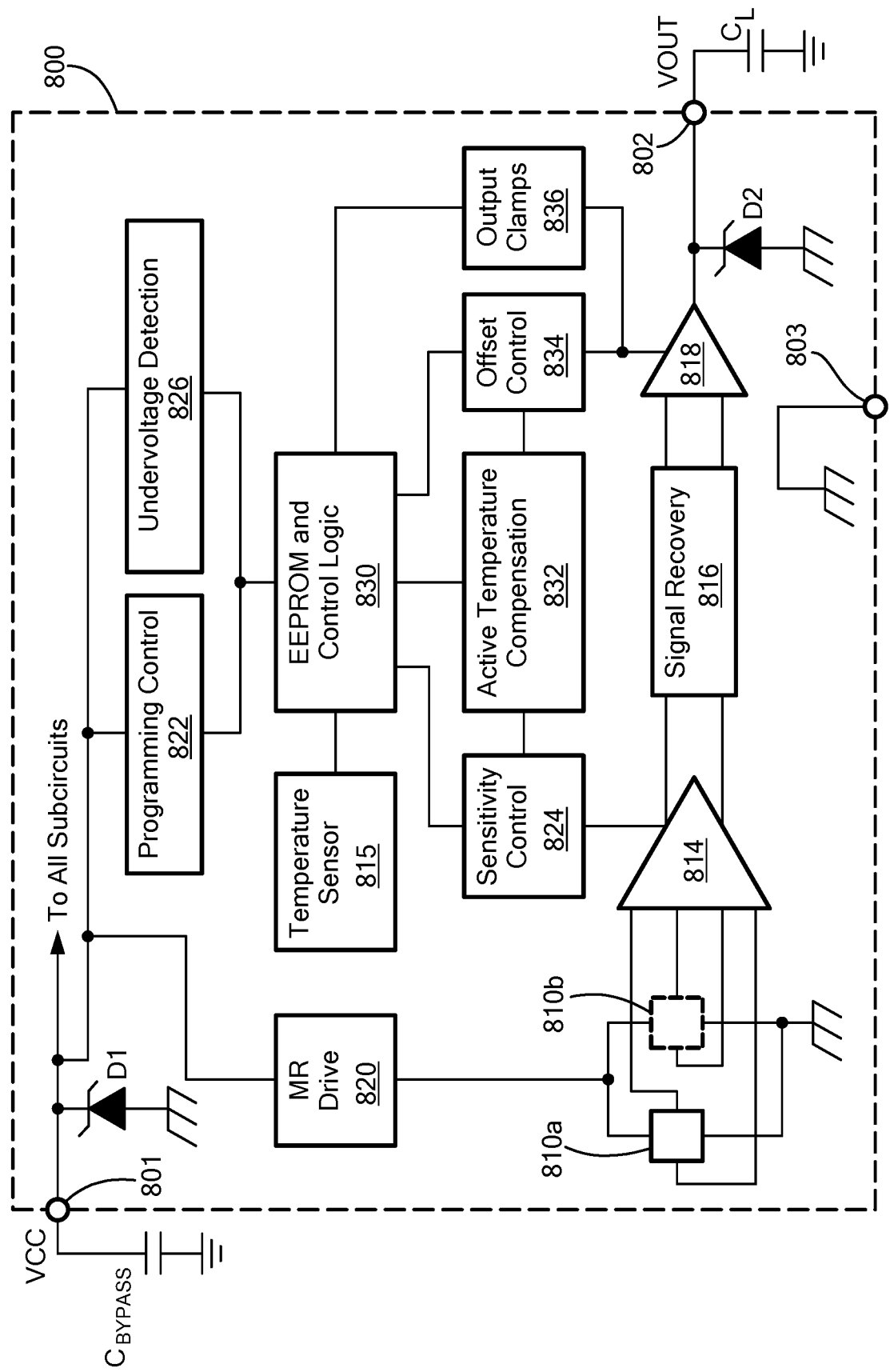
FIG. 8 is a schematic of a current sensor of the type including the bridges of FIG. 2 or the bridges of FIG. 6.

Referring to FIG. 8, a schematic block diagram of an example current sensor 800 as can form part of current sensor 300 of FIG. 3 or current sensor 700 of FIG. 7 can include the above-described bridge circuits such as the bridge circuit 200 of FIG. 2 or the bridge circuit 600 of FIG. 6. Current sensor 800 includes one or more bridge circuits or bridges 810a, 810b comprising magnetic field sensing elements. In the case of using bridge circuit 200 of FIG. 2, each of the bridges 810a, 810b can correspond to a bridge circuit 204, 208, respectively. And, in the case of using bridge circuit 600 of FIG. 6, bridge circuit 810b can be omitted and the parallel coupled bridges 604, 608 can correspond to bridge 810a. The sensing elements comprising bridge circuit 810a and/or 810b can include be TMR or other magnetoresistance elements for example.

Example current sensor 800 has three pins or external connections, including a power supply pin, or VCC 801, a VOUT (output signal) pin 802, and a GND (ground) pin 803. The VCC pin 801 is used for the input power supply or supply voltage for the current sensor 800. It will be appreciated that in embodiments in which bridge 810a corresponds to the bridge circuit 600 of FIG. 6, the supply pin 801 can receive a supply current ICC rather than a voltage. A bypass capacitor, $C_{BYPASS}$, can be coupled between the VCC pin 801 and ground. The VCC pin 801 can also be used for programming the current sensor 800. The VOUT pin 802 is used for providing the output signal for the current sensor 800 indicative of a current (e.g., current 352 of FIG. 3) to circuits and systems (not shown) and can also be used for programming. It will be appreciated that in embodiments in which bridge 810a corresponds to the bridge circuit 600 of FIG. 6, the output pin 802 can provide a current output signal rather than a voltage output signal. An output load capacitance CL is coupled between the VOUT pin 802 and ground. The example current sensor 800 can include a first diode D1 coupled between the VCC pin 801 and chassis ground and a second diode D2 coupled between the VOUT pin 802 and chassis ground. A driver 820 can provide a power connection for the bridges 810a, 810b as may take the form of a voltage source VCC or current source Icc.

Output signals of the bridge circuits 810a, 810b are coupled to an amplifier 814. The amplifier 814 is configured to generate an amplified signal for coupling to the signal recovery circuit 816. In embodiments, amplifier 814 can be a differential amplifier to provide a subtraction element configured to receive the output signals of bridges 810a, 810b (e.g., where bridges 810a, 810b correspond to bridges 204, 208 of FIG. 2). A regulator (not shown) can be coupled between supply voltage VCC and ground and to the various components and sub-circuits of the sensor 800 to regulate the supply voltage.

A programming control circuit 822 is coupled between the VCC pin 801 and EEPROM and control logic 830 to provide appropriate control to the EEPROM and control logic circuit. EEPROM and control logic circuit 830 determines any application-specific coding and can be erased and reprogrammed using a pulsed voltage. A sensitivity control circuit 824 can be coupled to the amplifier 814 to generate and provide a sensitivity control signal to the amplifier 814 to adjust a sensitivity and/or operating voltage of the amplifier. An active temperature compensation circuit 832 can be coupled to sensitivity control circuit 824, EEPROM and control logic circuit 830, and offset control circuit 834. The offset control circuit 834 can generate and provide an offset signal to a push/pull driver circuit 818 (which may be an amplifier) to adjust the sensitivity and/or operating voltage of the driver circuit. The active temperature compensation circuit 832 can acquire temperature data from EEPROM and control logic circuit 830 via a temperature sensor 815 and perform necessary calculations to compensate for changes in temperature, if needed. Output clamps circuit 836 can be coupled between the EEPROM and control logic 830 and the driver 818 to limit the output voltage and for diagnostic purposes. For example, if the total output range can be from 0V to 5V, for magnetic fields from 0 G to 1000 G, it may be desired to use a clamp at 0.5V for any field below 100 G. For example, it may be known that below 100 G, the sensor 800 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 826 can operate to detect an undervoltage condition of the supply voltage level VCC. It will be appreciated that while FIG. 8 shows an example current sensor 800 primarily as an analog implementation, any appropriate current sensor topology can be used, including both digital, analog, and combined digital and analog implementations.

Figure 9:
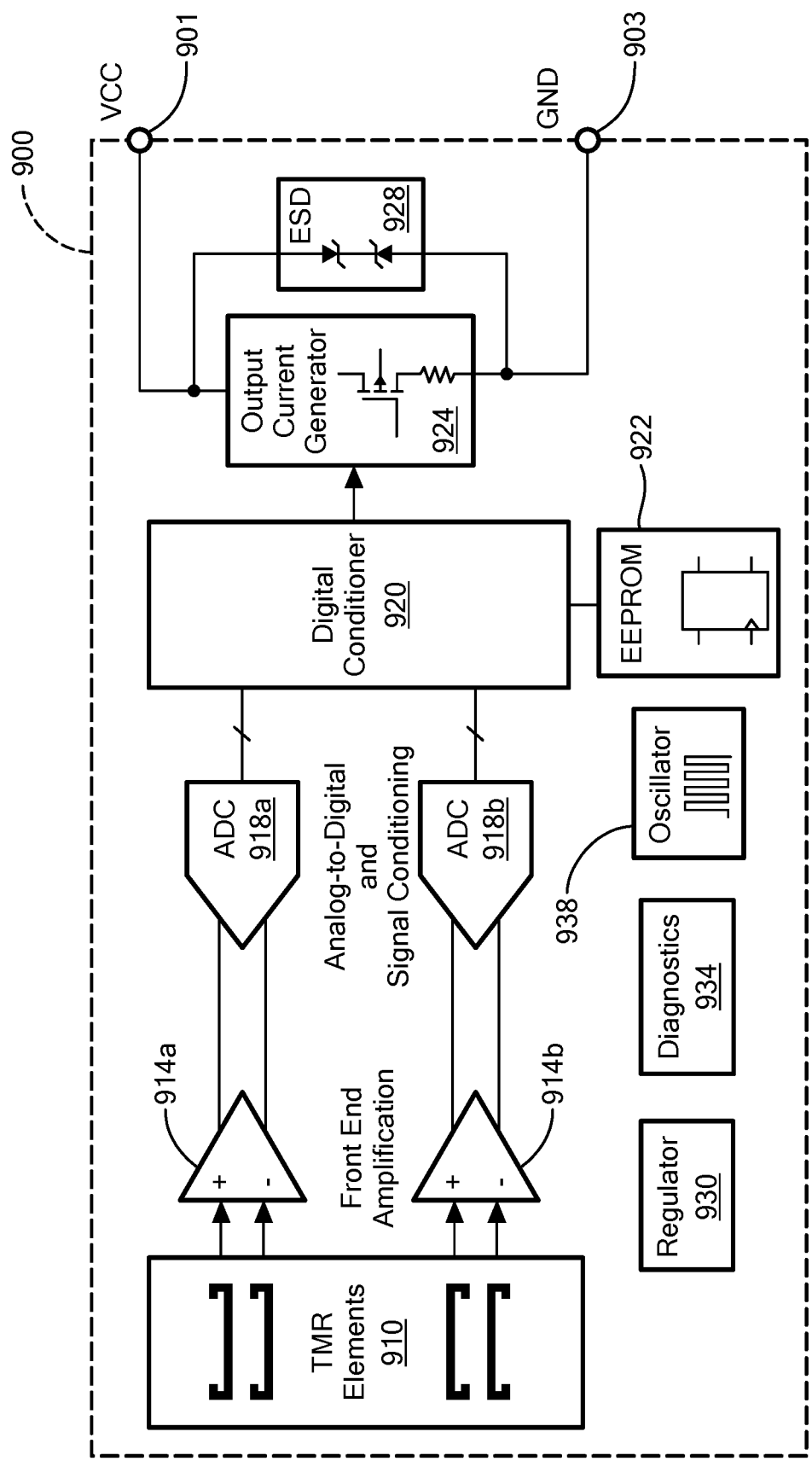
FIG. 9 a schematic of a movement/rotation sensor of the type including the bridges of FIG. 2 or the bridges of FIG. 6.

Referring also to FIG. 9, a movement/rotation sensor 900 of the type as can form part of rotation sensor 360 of FIG. 3A or rotation sensor 760 of FIG. 7A can include the above-described bridge circuits such as the bridges of FIG. 2 or the bridges of FIG. 6. In the case of the bridge circuit 200 of FIG. 2, MR elements 910 can include bridges 204 and 208. And, in the case of bridge circuit 600 of FIG. 6, MR elements 910 can include the parallel coupled bridge circuit 600. The sensing elements 910 can include be TMR or other magnetoresistance elements for example.

In embodiments in which MR elements 910 are arranged to provide two output signals (e.g., as in the two bridge arrangement of FIG. 2), each output signal can be coupled to a respective signal path. For example, a first signal path can include an amplifier 914a and an analog-to-digital converter (ADC) 918a and a second signal path can include an amplifier 914b and an ADC 918b. Alternatively in embodiments in which MR elements 910 are arranged to provide a single output signal (e.g., as in the parallel bridge arrangement of FIG. 6), one of the signal paths can be omitted.

The bridge output signal(s) thus conditioned can be further processed by a digital conditioner 920. Conditioner 920 can process the one or both input signals in order to determine a speed and/or direction of rotation of a target. An output current generator 924 can convert the conditioned signal into a current for communication to external systems via the VCC connection 901 and ground connection 903 in the illustrated so-called "two-wire" arrangement. It will be appreciated by those of ordinary skill in the art that although a two-wire interface is illustrated, the sensor 900 can alternatively communicate its output signal on a dedicated output signal pin (not shown) separate from the power connections 901, 903. Additional features of sensor 900 can include ESD protection 928 coupled across the sensor pins 901, 903, a regulator 930, diagnostic circuitry 934, an oscillator 938, and memory 922.

It will be appreciated that while FIG. 9 shows the example rotation sensor 900 primarily as a digital implementation, any appropriate current sensor topology can be used, including both digital, analog, and combined digital and analog implementations.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. A magnetic field sensor comprising:
a first bridge comprising a first magnetoresistance (MR) element, a second MR element, a third MR element, and a fourth MR element, wherein the first MR element is coupled between a power source and a first output node, the second MR element is coupled between the power source and a second output node, the third MR element is coupled between the second output node and ground, and the fourth MR element is coupled between the first output node and ground;
a second bridge comprising a fifth MR element, a sixth MR element, a seventh MR element, and an eighth MR element, wherein the fifth MR element is coupled between the power source and a third output node, the sixth MR element is coupled between the power source and a fourth output node, the seventh MR element is coupled between the fourth output node and ground, and the eighth MR element is coupled between the third output node and ground; and
wherein each of the first MR element, the third MR element, the fifth MR element, and the seventh MR element has a first magnetic reference direction and wherein each of the second MR element, fourth MR element, sixth MR element, and eighth MR element has a second magnetic reference direction opposite to the first magnetic reference direction; and
wherein the first bridge and the second bridge are coupled in parallel to form a parallel bridge circuit with the first output node connected to the third output node at a first output of the parallel bridge circuit and with the second output node connected to the fourth output node at a second output of the parallel bridge circuit.

2. The magnetic field sensor of claim 1, wherein the first bridge is positioned to sense a first uniform magnetic field of a first polarity and wherein the second bridge is positioned to sense a second uniform magnetic field of a second polarity opposite to the first polarity, wherein the first uniform magnetic field and the second uniform magnetic field are generated by a common magnetic field source and have equal magnitudes.

3. The magnetic field sensor of claim 1, wherein a first electrical signal between the first and second output nodes is indicative of the first uniform magnetic field and a second electrical signal between the third and fourth output nodes is indicative of the second uniform magnetic field.

4. The magnetic field sensor of claim 3, further comprising a subtraction element coupled to receive the first electrical signal and the second electrical signal and configured to generate a subtraction signal indicative of a difference between the first electrical signal and the second electrical signal, wherein the subtraction signal is immune to a stray magnetic field and is indicative of the magnitude of the first uniform magnetic field.

5. The magnetic field sensor of claim 2, wherein the power source is a current source and wherein a differential current signal between the first output node and the second output node is immune to a stray magnetic field and is indicative of the magnitude of the first uniform magnetic field.

6. The magnetic field sensor of claim 2, wherein the first uniform magnetic field and the second uniform magnetic field are generated by a current conductor.

7. The magnetic field sensor of claim 6, wherein the first uniform magnetic field and the second uniform magnetic field are generated by movement of a ferromagnetic object.

8. The magnetic field sensor of claim 1, wherein each of the first MR element, the second MR element, the third MR element, the fourth MR element, the fifth MR element, the sixth MR element, the seventh MR element, and the eighth MR element comprises a TMR element.

9. The magnetic field sensor of claim 1, wherein either the first MR element, the third MR element, the fifth MR element, and the seventh MR element are re-pinned to have the first magnetic reference direction or the second MR element, the fourth MR element, the sixth MR element, and the eighth MR element are re-pinned to have the second magnetic reference direction.

10. A magnetic field sensor system comprising:
a first bridge comprising a first magnetoresistance (MR) element, a second MR element, a third MR element, and a fourth MR element, wherein the first MR element is coupled between a power source and a first output node, the second MR element is coupled between the power source and a second output node, the third MR element is coupled between the second output node and ground, and the fourth MR element is coupled between the first output node and ground;
a second bridge comprising a fifth MR element, a sixth MR element, a seventh MR element, and an eighth MR element, wherein the fifth MR element is coupled between the power source and a third output node, the sixth MR element is coupled between the power source and a fourth output node, the seventh MR element is coupled between the fourth output node and ground, and the eighth MR element is coupled between the third output node and ground; and wherein the first bridge is positioned to sense a first uniform magnetic field of a first polarity and wherein the second bridge is positioned to sense a second uniform magnetic field of a second polarity opposite to the first polarity, wherein the first uniform magnetic field and the second uniform magnetic field are generated by a common magnetic field source and have equal magnitudes; and wherein the first bridge and the second bridge are coupled in parallel to form a parallel bridge circuit with the first output node connected to the third output node at a first output of the parallel bridge circuit and with the second output node connected to the fourth output node at a second output of the parallel bridge circuit.

11. The magnetic field sensor of claim 10, wherein each of the first MR element, the third MR element, the fifth MR element, and the seventh MR element has a first magnetic reference direction and wherein each of the second MR element, fourth MR element, sixth MR element, and eighth MR element has a second magnetic reference direction opposite to the first magnetic reference direction.

12. The magnetic field sensor of claim 10, wherein a first electrical signal between the first and second output nodes is indicative of the first uniform magnetic field and a second electrical signal between the third and fourth output nodes is indicative of the second uniform magnetic field.

13. The magnetic field sensor of claim 12, further comprising a subtraction element coupled to receive the first electrical signal and the second electrical signal and configured to generate a subtraction signal indicative of a difference between the first electrical signal and the second electrical signal, wherein the subtraction signal is immune to a stray magnetic field and is indicative of the magnitude of the first uniform magnetic field.

14. The magnetic field sensor of claim 10, wherein the power source is a current source and a differential current signal between the first output node and the second output node is immune to a stray magnetic field and is indicative of magnitude of the first uniform magnetic field.

15. The magnetic field sensor of claim 10, wherein the first uniform magnetic field and the second uniform magnetic field are generated by a current conductor.

16. The magnetic field sensor of claim 10, wherein the first uniform magnetic field and the second uniform magnetic field are generated by movement of a ferromagnetic object.

17. The magnetic field sensor of claim 10, wherein each of the first MR element, the second MR element, the third MR element, the fourth MR element, the fifth MR element, the sixth MR element, the seventh MR element, and the eighth MR element comprises a TMR element.

18. The magnetic field sensor of claim 11, wherein either the first MR element, the third MR element, the fifth MR element, and the seventh MR element are re-pinned to have the first magnetic reference direction or the second MR element, the fourth MR element, the sixth MR element, and the eighth MR element are re-pinned to have the second magnetic reference direction.

19. A magnetic field sensor comprising:
a composite bridge comprising a first magnetoresistance (MR) element and a sixth MR element coupled in series to form a first bridge leg between a power source and a first output node, a second MR element and a seventh MR element coupled in series to form a second bridge leg between the power source and a second output node, a third MR element and an eighth MR element coupled in series to form a third bridge leg between the second output node and ground, and a fourth MR element and a fifth MR element coupled in series to form a fourth bridge leg between the first output node and ground;

wherein each of the first MR element, the third MR element, the fifth MR element, and the seventh MR element has a first magnetic reference direction; and wherein each of the second MR element, the fourth MR element, the sixth MR element, and the eighth MR element has a second magnetic reference direction that is opposite with respect to the first magnetic reference direction.

20. The magnetic field sensor of claim 19, wherein the first MR element, the second MR element, the third MR element and the fourth MR element are positioned to sense a first uniform magnetic field of a first polarity and wherein the fifth MR element, the sixth MR element, the seventh MR element, and the eighth MR element are positioned to sense a second uniform magnetic field of a second polarity opposite to the first polarity, wherein the first uniform magnetic field and the second uniform magnetic field are generated by a common magnetic field source and have equal magnitudes.

21. The magnetic field sensor of claim 20, wherein an electrical signal between the first and second output nodes is immune to a stray magnetic field and is indicative of the magnitude of the first uniform magnetic field.

* * * * *

UNITED STATES PATENT AND TRADEMARK OFFICE
CERTIFICATE OF CORRECTION

| | | |
|---|---|---|
| PATENT NO. | : 12,181,538 B2 | Page 1 of 1 |
| APPLICATION NO. | : 18/070918 | |
| DATED | : December 31, 2024 | |
| INVENTOR(S) | : Hernán D. Romero | |

It is certified that error appears in the above-identified patent and that said Letters Patent is hereby corrected as shown below:

In the Specification

Column 8, Line 44, delete "power source" and replace with --power source $V_{sup}$--.

Column 8, Line 45, delete "power source" and replace with --power source $V_{sup}$--.

Column 10, Line 53, delete "power source" and replace with --power source $V_{sup}$--.

Column 10, Line 55, delete "power source" and replace with --power source $V_{sup}$--.

Column 15, Line 4, delete "GB" and replace with --$G_B$--.

Column 16, Line 63, delete "CL" and replace with --$C_L$--.

In the Claims

Column 18, Line 56, delete "; and" and replace with --;--.

Column 19, Line 67, replace "; and" and replace with --;--.

Signed and Sealed this
First Day of July, 2025

Coke Morgan Stewart
*Acting Director of the United States Patent and Trademark Office*